United States Patent [19]
Ooishi

[11] Patent Number: 6,147,927
[45] Date of Patent: Nov. 14, 2000

[54] SYNCHRONOUS SEMICONDUCTOR MEMORY DEVICE CAPABLE OF MORE RELIABLE COMMUNICATION OF CONTROL SIGNAL AND DATA

[75] Inventor: Tsukasa Ooishi, Hyogo, Japan

[73] Assignee: Mitsubishi Denki Kabushiki Kaisha, Tokyo, Japan

[21] Appl. No.: 09/324,804

[22] Filed: Jun. 3, 1999

[30] Foreign Application Priority Data

Dec. 22, 1998 [JP] Japan .................................. 10-365097

[51] Int. Cl.[7] .................................................. G11C 8/00
[52] U.S. Cl. ........................... 365/233; 365/191; 365/241
[58] Field of Search .................................. 365/233, 239, 365/236, 241, 191, 189.07

[56] References Cited

U.S. PATENT DOCUMENTS

| | | | |
|---|---|---|---|
| 5,339,440 | 8/1994 | Jacobs et al. ........................... | 395/325 |
| 5,629,897 | 5/1997 | Iwamoto et al. ........................ | 365/195 |
| 5,708,611 | 1/1998 | Iwamoto et al. ........................ | 365/195 |
| 5,754,838 | 5/1998 | Shibata et al. ........................... | 395/559 |

FOREIGN PATENT DOCUMENTS 10-164039  6/1998  Japan .

OTHER PUBLICATIONS

"A PLL Clock Generator with 5 to 110 MHz of Lock Range for Microprocessors", I. Young et al., IEEE Journal of Solid State Circuits, vol. 27, No. 11, Nov. 1992, pp. 1599–1607.
"Fully Integrated CMOS Phase–Locked Loop with 15 to 240 MHz Locking Range and ±50 ps Jitter", I. Novof et al., IEEE Journal of Solid–State Circuits, vol. 30, No. 11, Nov. 1995, pp.1259–1266.

*Primary Examiner*—David Nelms
*Assistant Examiner*—Thong Le
*Attorney, Agent, or Firm*—McDermott, Will & Emery

[57] ABSTRACT

In an SDRAM, an unlocked-state detection circuit detects whether synchronization between an external clock signal and an internal clock signal generated in the SDRAM according to the external clock signal is locked. When the internal clock signal is inappropriately locked, a signal output from the SDRAM to a memory controller transitions low, and the controller ignores data received and the SDRAM performs a process to ignore an input command.

14 Claims, 29 Drawing Sheets

SYNCHRONOUS SEMICONDUCTOR MEMORY DEVICE CAPABLE OF MORE RELIABLE COMMUNICATION OF CONTROL SIGNAL AND DATA

BACKGROUND OF THE INVENTION

1. Field of the Invention

The present invention relates to semiconductor memory devices and in particular to synchronous semiconductor memory devices operating in synchronization with an external clock signal.

More specifically, the present invention relates to improving the reliability of a memory system configured of a synchronous semiconductor memory device provided with a synchronizing internal clock generating circuit.

2. Description of the Background Art

With the improvement of microprocessors (MPUs) in operating speed in recent years, synchronous dynamic random access memory (SDRAM) and the like operating in synchronization with a clock signal have been used to achieve rapid access to dynamic random access memory (DRAM) and the like.

FIG. 30 is a timing chart for representing an operation of such an SDRAM in inputting data.

More specifically, in response to an external clock signal ext.CLK a delay locked loop (DLL) circuit mounted in the SDRAM generates a clock signal int.CLK of a data latch portion for externally receiving data.

In generating clock signal int.CLK, a clock signal input to the DLL circuit in the SDRAM delays by an internal delay τ1, as compared to external clock signal ext.CLK.

There is also a delay time corresponding to a wiring delay (a time τ2) cause before a signal output from the DLL circuit arrives at the data latch portion in a data input portion.

Thus the DLL circuit generates an internal clock signal which previously advances by time τ2 in phase with respect to a rising edge of external clock signal ext.CLK. In other words, the DLL circuit outputs a clock signal advancing by a time τ3(=τ1+τ2) in phase as internal clock signal int.CLK.

Consequently, in a data input/output portion at the data latch portion, external and internal clock signals ext.CLK and int.CLK are signals matched in phase.

Thus, operation of the DLL circuit is calibrated so that a rising edge of external clock signal ext.CLK or a rising edge of internal clock signal int.CLK controlling the SDRAM's data receiving operation is positioned exactly at the center of an eye pattern of a data signal supplied to the SDRAM.

When a rising edge of internal clock signal ext.CLK is positioned at the center of the eye of data, operating margin will be maximized.

However, such improvement in operating margin can only be achieved when internal clock signal int.CLK is always generated reliably with respect to external clock signal ext.CLK.

Typically, however, system noise and the like often prevent the operation of generating internal clock signal int.CLK.

When system noise and the like prevent the phasing operation of the synchronizing internal clock generating circuit and locked phases of external and internal clock signals ext.CLK and int.CLK are unlocked, a data receiving margin can be degraded and a data-input error can be caused.

SUMMARY OF THE INVENTION

One object of the present invention is to provide a synchronous semiconductor memory device free of data reception error when synchronous operation of a synchronizing internal clock generating circuit generating an internal clock signal is prevented by system noise or the like.

Another object of the present invention is to provide a synchronous semiconductor memory device provided with a synchronizing internal clock generating circuit capable of preventing a system error while reducing a time required for achieving synchronization with an external clock signal.

The present invention is a synchronous semiconductor memory device receiving an address signal and a control signal in synchronization with an external clock signal and including a memory cell array, a control circuit, a synchronizing internal signal generating circuit, a synchronous-condition detecting circuit and an output node.

The memory cell array has a plurality of memory cells arranged in rows and columns. The control circuit controls operation of the synchronous semiconductor memory device. The synchronizing internal signal generating circuit outputs an internal clock signal synchronized with an external clock signal.

The synchronous-condition detecting circuit monitors a condition of synchronization of the external and internal clock signals to generate a synchronous-condition determining signal. The output node outputs the synchronous-condition determining signal external to the synchronous semiconductor memory device.

Preferably the synchronous semiconductor memory device further includes a control signal input circuit synchronized with the internal clock signal to receive and supply a control signal to the control circuit and the control circuit halts a process associated with the control signal when the synchronous-condition determining signal indicates an inappropriate condition of synchronization.

Alternatively the synchronous semiconductor memory device preferably further includes a data input/output circuit holding and outputting data read from a memory cell selected in response to an address signal, and delaying outputting the read data in response to the synchronous-condition determining signal indicating an inappropriate condition of synchronization.

Thus a main advantage of the present invention is that a result of monitoring a condition of synchronization of external and internal clock signals that can be externally output allows a controller to detect an influence of system noise with the present invention incorporated in a memory system.

Another advantage of the present invention is that data communication stops when the internal clock signal is inappropriately locked, so that system error can be avoided when the inappropriately locked state is caused.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic block diagram showing a partially extracted configuration of a data input/output portion of a command signal CMD, an address signal AMD, a data signal DAT and the like.

DESCRIPTION OF THE PREFERRED EMBODIMENTS

[First Embodiment]

Figure 1:
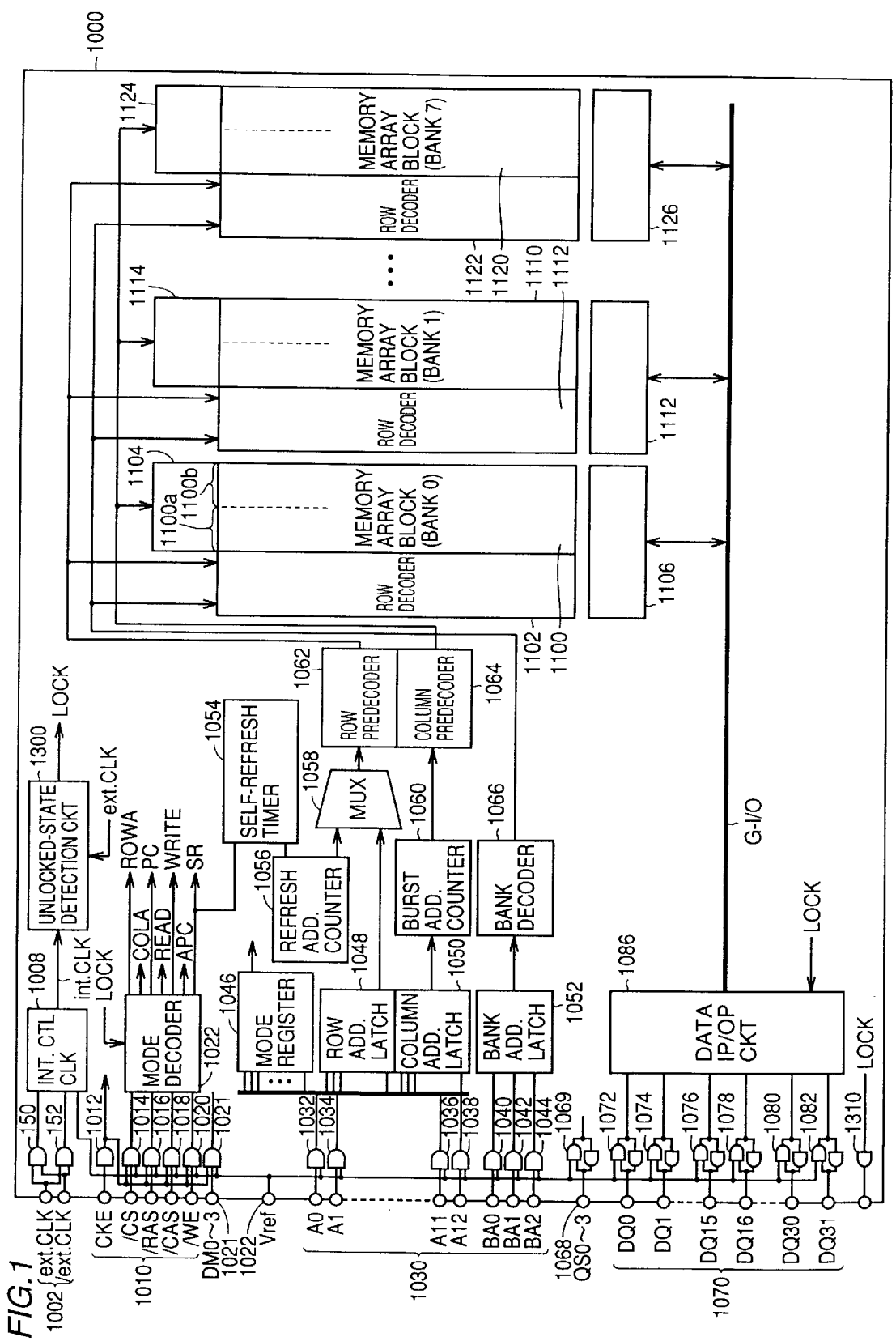
FIG. 1 is a schematic block diagram showing a configuration of a synchronous semiconductor memory device 1000 according to a first embodiment of the present invention.

FIG. 1 is a schematic block diagram showing a configuration of a synchronous semiconductor memory device 1000 according to a first embodiment of the present invention.

SDRAM 1000 includes an external clock signal input terminal 1002 receiving externally applied, complementary clock signals ext.CLK and ext./CLK, clock input buffers 150 and 152 buffering the clock signals input via external clock terminal 1002, an internal control clock signal generation circuit 1008 receiving outputs from clock buffers 150 and 152 to generate an internal clock signal int.CLK, an unlocked-state detection circuit 1300 receiving internal and external clock signals int.CLK and ext.CLK and outputting a locked-state detection signal LOCK in response to a condition of synchronization of the two clock signals, and a mode decoder 1022 receiving external control signals input from an external control signal input terminal 1010 via input buffers 1012 to 1020 operating in response to internal clock signal int.CLK.

Internal control signal input terminal 1010 receives a signal CKE, a chip select signal /CS, a row address strobe signal /RAS, a column address strobe signal /CAS, a write control signal /WE, and data mask signals DM0 to DM3.

Signal CKE is a signal for indicating that inputting a control signal to a chip is enabled. Unless the signal is activated, inputting a control signal is not permitted and SDRAM 1000 does not operate.

Signal /CS is a signal for determining whether a command signal has been input. With this signal active (low), at a rising edge of a clock signal a command is determined depending on a combination of levels of the other control signals.

Signal /RAS is a signal indicative of operation of row-associated circuitry and signal /CAS instructs activation of operation of column-associated circuitry. Signal /WE is a signal for distinguishing between write and read operations.

Signals DM0 to DM3 are signals indicative of the operation masking the data communication via data input/output terminals DQ0–DQ7, DQ8–DQ15, DQ16–DQ23, DQ24–DQ31, respectively.

Mode decoder 1022 responds to the external control signals to output an internal control signal for controlling an operation of internal circuitry of SDRAM 1000. Mode decoder 1022 outputs, e.g., signals ROWA, COLA, ACD, PC, READ, WRITE, APC, SR, as internal control signals. Signal ROWA indicates that row-related access is performed. Signal COLA indicates that column-related access is performed. Signal ACT indicates that a word line is activated.

Signal PC instruct precharge operation, indicating that operation of the row-associated circuitry is terminated. Signal READ instructs the column-associated circuitry to perform read operation. Signal WRITE instructs the column-associated circuitry to perform write operation.

Signal APC indicates auto-precharge operation. With auto-precharge operation designated, when a burst cycle completes a precharge operation is started automatically. Signal SR indicates self-refresh operation. When self-refresh operation is started a self-refresh timer operates, and when a predetermined period of time has elapsed since the initiation of the timer operation a word line is activated to start refresh operation.

Mode decoder 1022 stops decoding input control signals responsively when locked-state detection signal LOCK from unlocked-state detection circuit 130 is inactivated (or unlocked), ignoring any externally applied control signal in the unlocked-state. When signal LOCK is again activated (or locked), mode decoder 1022 performs the operation of decoding into internal control signals in response to control signals retransmitted externally.

SDRAM 1000 also includes a self-refresh timer 1054. Timer 1054 starts to operate when signal SR designates self-refresh mode. When a predetermined period of time has elapsed since the initiation of the timer operation, timer 1054 instructs activation of a word line or initiation of refresh operation. SDRAM 1000 also includes a refresh counter 1056 for generating an address for performing a refresh operation according to an indication from self-refresh timer 1054.

SDRAM 1000 also includes a reference potential input terminal 1022 receiving a signal VREF serving as a reference for determining whether an input signal is a high level signal or a low level signal, a mode register 1046 responsive to an address signal applied via address signal input terminal 1030 and a combination of the above-described external control signals for holding the information on a predetermined mode of operation, such as data for burst length, a row address latch 1048 receiving an address signal via address signal input buffers 1032–1038 operating in response to an internal clock signal int.CLK2, and holding an input row address at row-address input timing, a column address latch 1050 receiving address signals A0–A12 and holding a column address at a timing at which the column address is input, a multiplexer 1058 receiving an output from refresh address counter 1056 and an output from row address latch 1048 and selectively outputting the output from row address latch 1048 in normal operation and the output from refresh address counter 1056 in self-refresh operation, a row predecoder 1062 receiving an output from multiplexer 1058 for predecoding a row address, a burst address counter 1060 referring to a column address held in column address latch 1050 to generate an internal column address depending on data of burst-length from mode register 1046, a column predecoder 1064 receiving an output from burst address counter 1060 to predecode a corresponding column address, a bank address latch 1052 receiving bank addresses BA0–BA2 from an address input terminal via input buffers 1040–1044 operating in response to internal clock signal INT.CLK2, and holding a designated bank-address value, and a bank decoder 1066 receiving an output from bank address latch 1052 to decode a bank address.

It should be noted that an address signal input from address signal input terminal 1030 has a combination of some of the bits thereof used to write data in the mode register in writing the information of a mode of operation into the mode register. For example, a combination of a predetermined number of bits of the address signal designates setting of the value of a burst length BL, a CAS latency CL or the like.

Bank address signals BA0–BA2 indicate an accessed bank at each of row-related access time and column-related access time. More specifically, at each of row- and column-related access times, bank address signals BLA0–BLA2 input to address signal input terminal 1030 are initially received in bank address latch 1052 and then decoded by bank decoder 1066 before they are transmitted to each memory array block (or bank).

SDRAM 1000 also includes memory array blocks 1100, 1110 and 1120 operating as banks 0 to 7 each as a unit capable of read/write operation independently, row decoders 1102, 1112 and 1122 responsive to an output from bank decoder 1066 and an output from row predecoder 1062 for selecting a corresponding bank's row (or word line), column decoders 1104, 1114 and 1124 responsive to an output from column predecoder 1064 for selecting a corresponding bank's column (or bit line pair), I/O ports 1106, 1116 and 1126 supplying data read from a selected memory cell of a selected bank to a global I/O bus G-I/O in read operation and supplying write data transmitted from bus G-I/O to a corresponding bank in write operation, a data input/output circuit 1086 holding write data externally applied and supplying the write data to bus G-I/O in write operation and holding read data transmitted from bus G-I/O in read operation, and bidirectional input/output buffers 1072–1082 for communicating input/output data DQ0–DQ31 between data input/output circuit 1086 and data input/output terminal 1070.

As will be described hereinafter, when locked-state detection signal LOCK from unlocked-state detection circuit 1300 is placed in inactive state (or unlocked state), data input/output circuit 1086 responsively suspends outputting held, read data until signal LOCK is again placed in active state (or locked state).

As will be described hereinafter, bidirectional input/output buffers 1072 to 1082 operate depending on data of operation mode held in mode resistor 1046, operating in synchronization with a first internal clock signal int.CLK1 in the operation mode of double-data-rate SDRAM (referred to as "DDR-SDRAM" hereinafter) and in synchronization with a second internal clock signal int.CLK2 in the operation mode of single-data-rate SDRAM (referred to as "SDR-SDRAM" hereinafter).

Signals QS0 to QS3 communicated to and from input/output terminal 1068 via bidirectional input/output buffer 1069 indicate timing of data communication via data input/output terminals DQ0–DQ7, DQ8–DQ15, DQ16–DQ23, and DQ24–DQ31, respectively.

Signals QS0 to QS3 will be generally referred to as a signal QS in the SDR-SDRAM operation mode and as a signal DQS in the DDR-SDRAM operation mode.

Figure 2:
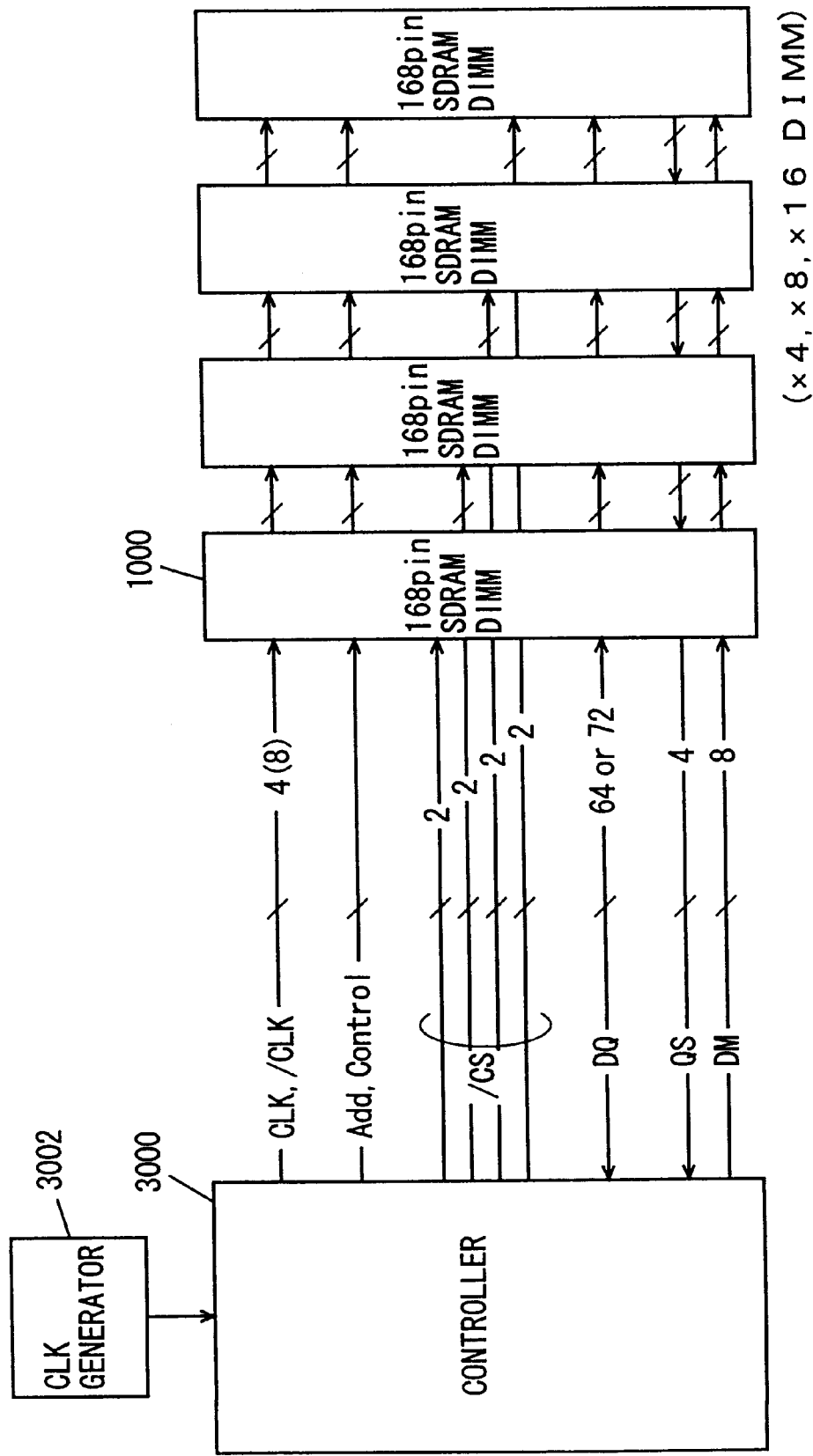
FIG. 2 is a schematic block diagram showing a configuration of a system in a uni-directional mode.

FIG. 2 is a schematic block diagram showing a configuration of a system in unidirectional mode.

In configuring a memory system, there is also bidirectional mode other than the FIG. 2 unidirectional mode, although a configuration of a system in unidirectional mode will now be described as an example.

In unidirectional mode, a controller 3000 receives a clock signal from a clock generation circuit 3002 and via controller 3000 clock signals ext.CLK and /ext.CLK are transmitted to SDRAM 1000.

An address signal, a control signal, chip select signal /CS, data mask signal DM and the like are also supplied from controller 3000 to SDRAM 1000.

It should be noted, however, that since clock signals ext.CLK and /ext.CLK are supplied from controller 3000 to SDRAM 1000, data is written in synchronization with external clock signal ext.CLK. In reading data from SDRAM 1000, signal QS indicative of a timing at which data is output from SDRAM 1000 is output in synchronization with output data DQ and controller 3000 receives read data DQ in synchronization with signal QS.

Figure 3:
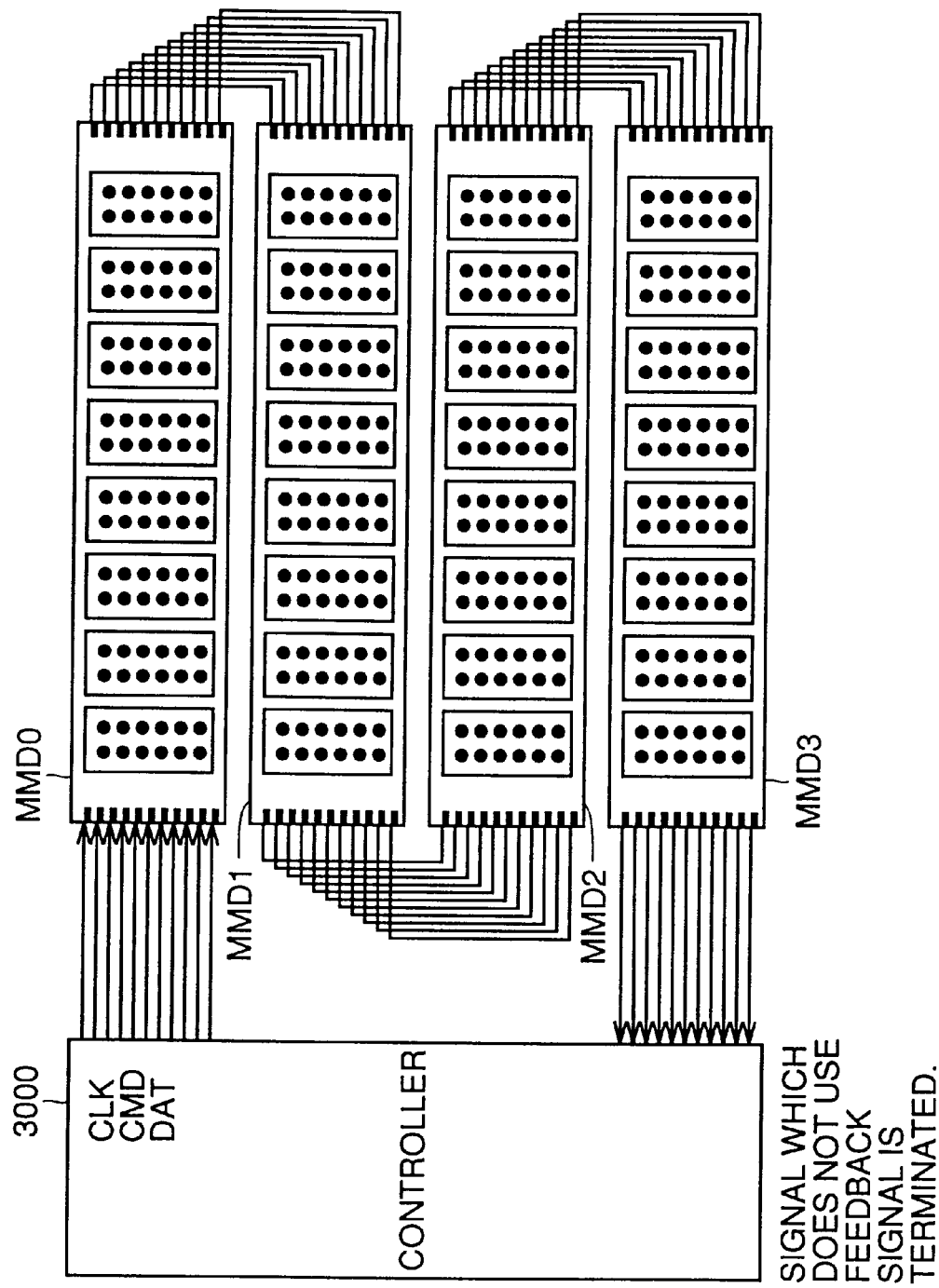
FIG. 3 is a schematic block diagram for illustrating in detail a connection between each memory module and a controller 3000.

FIG. 3 is a schematic block diagram for illustrating in detail a connection between each memory module and controller 3000 in the FIG. 2 memory system.

As shown in FIG. 3, in the memory system configured of controller 3000 and a memory chip 1000, controller 3000 transmits clock signal ext.CLK, a command signal CMD and a data signal DAT are transmitted to memory chip 1000 provided on memory modules MMD0 to MMD3.

Memory chip 1000 communicates data with controller 3000. In recent years, memory systems have as high synchronization frequencies as more than several hundreds MHz. Thus, data communicating margin is reduced between controller 3000 and memory chip 1000.

A main cause of such margin reduction is the parasitic inductance L, parasitic capacitance C and parasitic resistance R in module wiring, a parameter varied between modules, and the like.

In particular, if data transmitted in synchronization with a clock signal is offset in phase or the like from the clock signal, the data transmitted in synchronization with the clock that is transmitted from the controller to a memory chip or vice versa causes a fetch error on the receiving side when the data is fetched by a receiver on the receiving side, since an edge of the clock and an eye pattern of the data fail to successfully match in timing.

Such errors as a fetch error can, however, be eliminated by calibrating a difference in propagation delay between the clock signal and the data signal when the system is constructed, since parasitic inductance L, parasitic capacitance C, parasitic resistance R and the varied module parameter do not vary in a short term.

However, as will be described hereinafter, a fetch error is also caused even after such calibration, when there is an offset in phasing caused at the receiving side with respect to a clock signal transmitted as a data receiving trigger.

Figure 4:
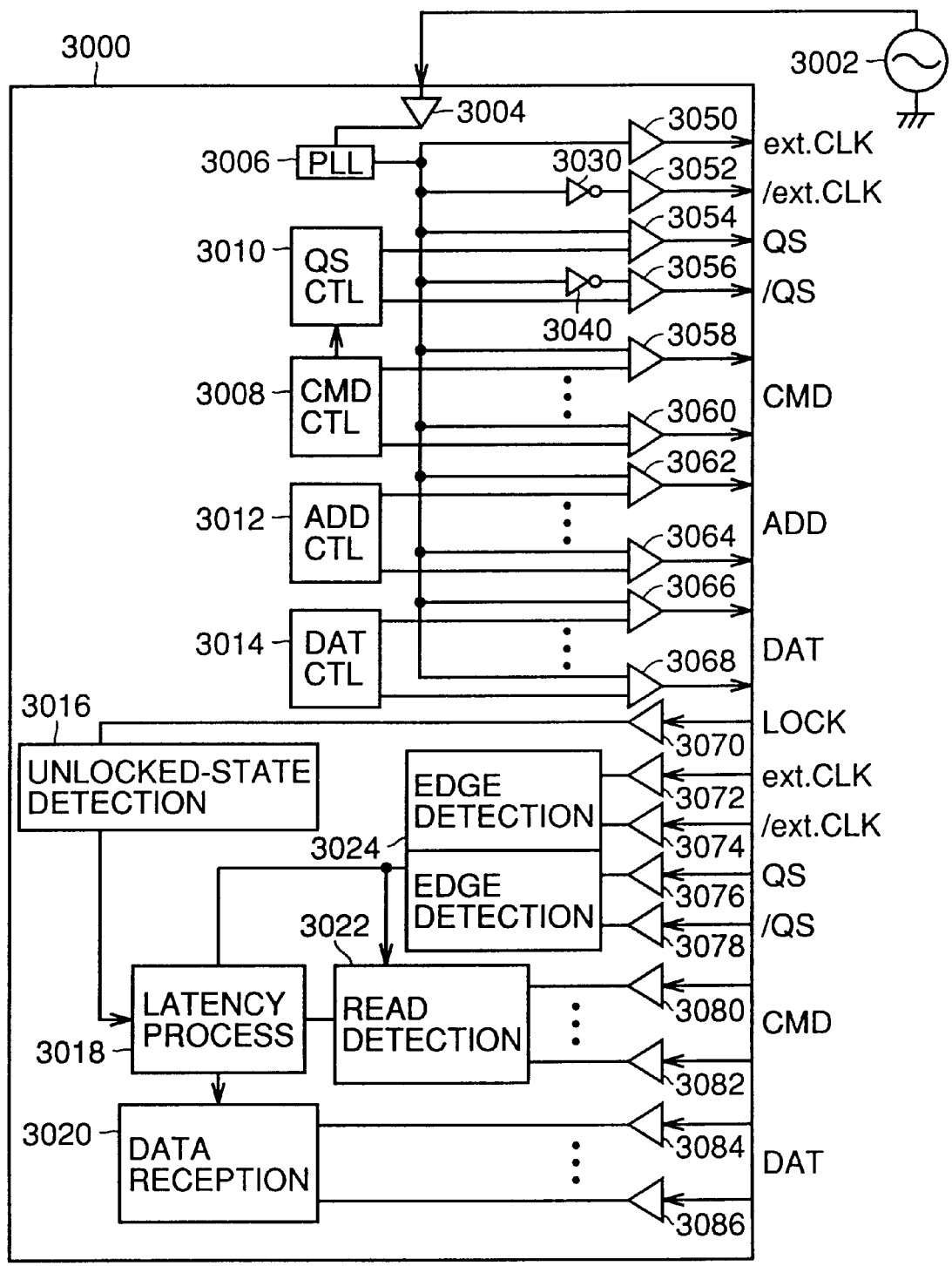
FIG. 4 is a schematic block diagram for illustrating in detail a configuration of controller 3000.

FIG. 4 is a schematic block diagram for illustrating in detail a configuration of the FIG. 3 controller 3000.

Controller 3000 receives at an input buffer 3004 a system clock from clock generator 3002. An output from input buffer 3004 is received by a PLL circuit 3006 which in turn generates an operating clock N times in frequency. The operating clock is output via an output buffer 3050 as clock signal ext.CLK and via an inverter 3030 and an output buffer 3052 as clock signal ext.CLK.

A command control portion 3008 outputs command signal CMD to SDRAM 1000 via output buffers 3058 to 3060, and command control portion 3008 in the mode of write operation controls QS control portion 3010 and a signal output from PLL circuit 3006 is also used to output a write clock QS via output buffer 3054.

Also controlled by QS control portion 3010, output buffer 3056 receives a signal output from PLL circuit 3006 and inverted by inverter 3040 and outputs write clock signal /QS.

An address control portion 3012 outputs an address signal ADD to SDRAM 1000 via output buffers 3062 to 3064.

Data control portion 3014 outputs data DAT to SDRAM 1000 via output buffers 3066 to 3068 in synchronization with a clock signal output from PLL circuit 3006

Input buffers 3072 and 3074 receive and apply clock signals ext.CLK and /ext.CLK to controller 3000, and in response to an output from input buffers 3072 and 3074 an edge detection portion 3024 detects a rising edge of a clock signal to control data receiving operation.

In data reception, signals QS and /QS are also supplied from SDRAM 1000 to controller 3000 and controller 3000 receives signals QS and /QS via input buffers 3076 and 3078. A signal from input buffers 3076 and 3078 also has a rising edge detected by edge detection portion 3024 to control signal receiving operation.

A read detection portion 3022 is controlled by edge detection portion 3024 to receive command signal CMD supplied to SDRAM 1000 via input buffers 3080 to 3082 and detects that a read operation is instructed from controller 3000.

According to a detection result from read detection portion 3022, a latency process portion 3018 instructs a data receiving circuit 3020 to receive data when a predetermined latency (a number of clocks counted from designation of a read command until initiation of data output) has elapsed.

Data receiving portion 3020 receives data DAT from SDRAM 1000 via input buffers 3084 to 3086.

As will be described later, controller 3000 receives via an input buffer buffer 3070 a signal LOCK output from SDRAM 1000 indicative of a locked condition of an internal clock generation circuit provided in SDRAM 1000. Unlocked-state detection circuit 3016 receives a signal from input buffer 3070. When unlocked-state detection circuit 3016 detects that the SDRAM 1000 side is in inappropriate locked condition, it provides an indication accordingly to latency process portion 3018.

Responsively, latency process portion 3018 instructs data receiving portion 3020 to stop data receiving operation.

Figure 5:
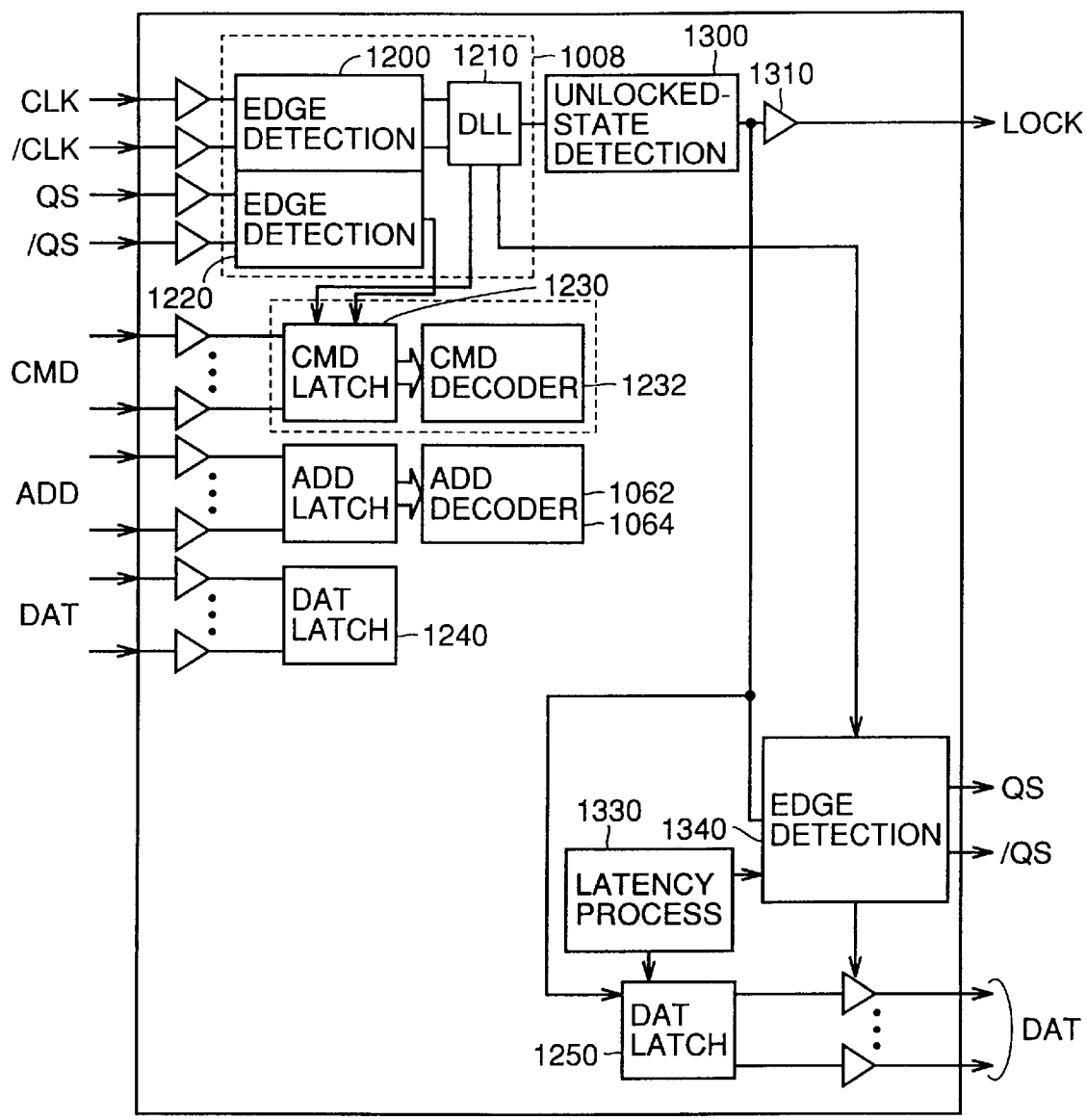

FIG. 5 is a schematic block diagram showing a partially extracted configuration of a data input portion for command signal CMD, address signal AMD, data signal DAT and the like and data output portion in the FIG. 1 SDRAM 1000.

External clock signals ext.CLK and /CLK are received via input buffers 150 and 152 and then have an activating edge detected by edge detection circuit 1200 provided in internal clock generation circuit 1008. In response to an output from edge detection circuit 1200, DLL circuit 1210 or the like generates internal clock signal int.CLK.

Signals QS and /QS are input via input buffer 1069 and similarly have an activating edge detected by edge detection circuit 1200 provided in internal control clock generation circuit 1088.

A command latch portion 1230 in mode decoder 1022 receives a command signal from controller 3000 via input buffers 1014 to 1020, and in response to an internal clock signal from DLL circuit 1224 receives and holds the command signal.

Receiving a signal from command latch portion 1230, command decoder 1232 detects a designated mode of operation to generate an internal control signal.

Address latch portions 1048 and 1050 receive and hold address signal ADD received via input buffers 1032 to 1044 and address decoders 1062 and 1064 generate an internal address signal in response to the address signal held by the address latch.

A data latch portion 1240 in data input/output circuit 1080 responds to a signal from edge detection portion 1022 or DLL circuit 1244 to receive and hold signal DAT received via data input/output buffers 1072 to 1082.

Also, unlocked-state detection circuit 1300 receives an output from DLL circuit 1224 to detect the current locked condition of DLL circuit 1224 to output signal LOCK via output buffer 1310.

Latency process portion 1330 detects a number of clocks corresponding to a designated latency that have been counted since application of a read command in read operation.

Edge detecting portion 1340 receives an output from DLL circuit 1224 and uses a detection result from latency control portion 1330 to output signals QS and /QS to controller 3000.

Edge detection portion 1340 is also controlled by unlocked-state detection circuit 1300 to stop outputting signals QS and /QS when DLL circuit 1224 is in unlocked state (or inappropriate locked condition). When locked condition is inappropriate, data is not received on the controller 3000 side.

Data latch portion 1250 in data input/output circuit 1086 holds data read from a memory cell array and outputs data to controller 3000 via data input/output buffers 1072-1082. Data latch portion 1250 is also controlled by unlocked-state detection circuit 1300 to suspend outputting data when DLL circuit 1224 is in unlocked-state (or inappropriate locked condition).

Figure 6:
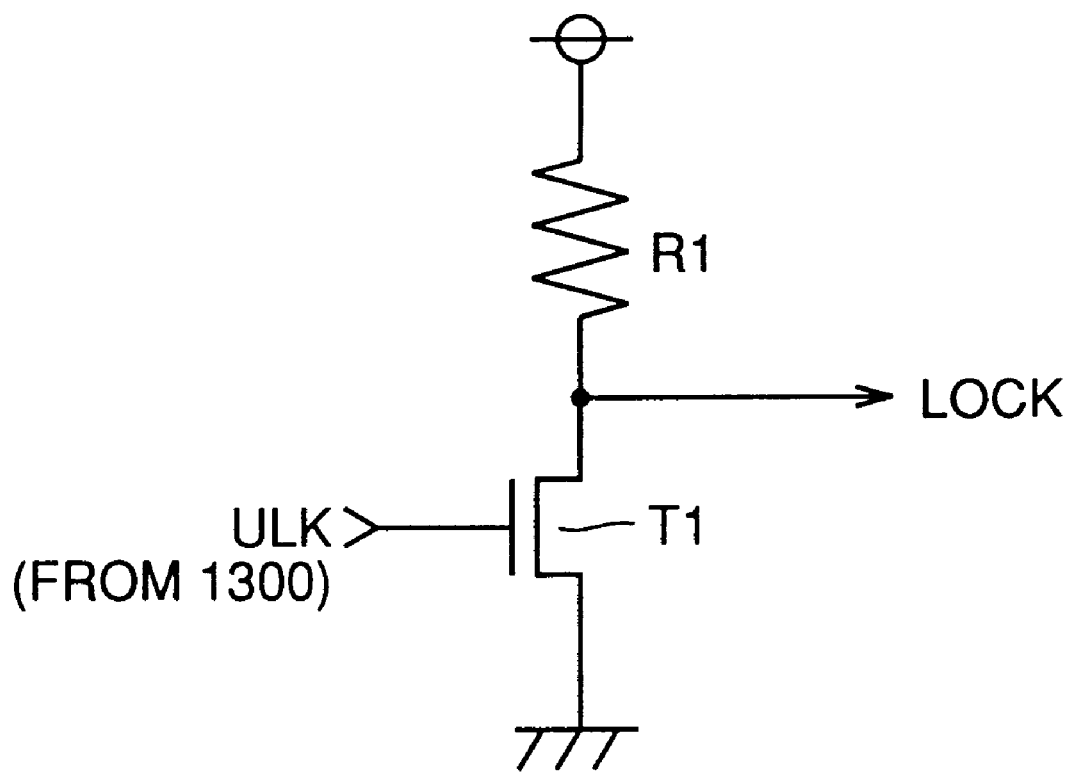
FIG. 6 is a schematic block diagram showing a configuration of the FIG. 5 output buffer 1310.

FIG. 6 is a schematic block diagram showing a configuration of the FIG. 5 output buffer 1310.

Output buffer 1310 includes a resistor R1 and an N-channel MOS transistor T1 connected in series between a power supply potential Vcc and a ground potential GND.

Transistor T1 has its gate potential controlled by a signal ULK output from unlocked-state detection circuit 1300.

The potential level of a connection point of resistor R1 and transistor T1 is output externally as lock signal LOCK.

More specifically, a condition of synchronization of DLL circuit 1224 is monitored by unlocked-state detection circuit 1300 to determine whether an edge of a clock signal for controlling a timing of data output from data latch portion 1250 is located at the center of an eye pattern of the data.

If DLL circuit 1224 has been locked, signal LOCK is active and also has its level fed back to controller 3000 and controller 30000 also monitors the locked state of DLL circuit 1224.

If SDRAM 1000 is unlocked, signal LOCK goes low to transmit to controller 3000 the fact that an internal clock is unlocked in SDRAM 1000.

In response to the signal LOCK, controller 3000 invalidates data and the like transmitted during the unlocked period and resumes communication of data and the like when recovery of the inappropriate locked condition to normal has been detected.

In transmitting data from memory chip 1000 to controller 3000, data signal DAT and signals QS and /QS are transmitted to controller 3000 at an edge of internal clock signal int.CLK reproduced in DLL circuit 1224 from a clock signal transmitted from controller 3000 to memory chip 1000.

This data communication is normally performed if DLL circuit 1224 is held locked.

If DLL circuit 1224 is unlocked, the data received by controller 3000 in the unlocked period is ignored. Memory chip 1000 also suspends outputting data during the unlocked period.

Figure 7:
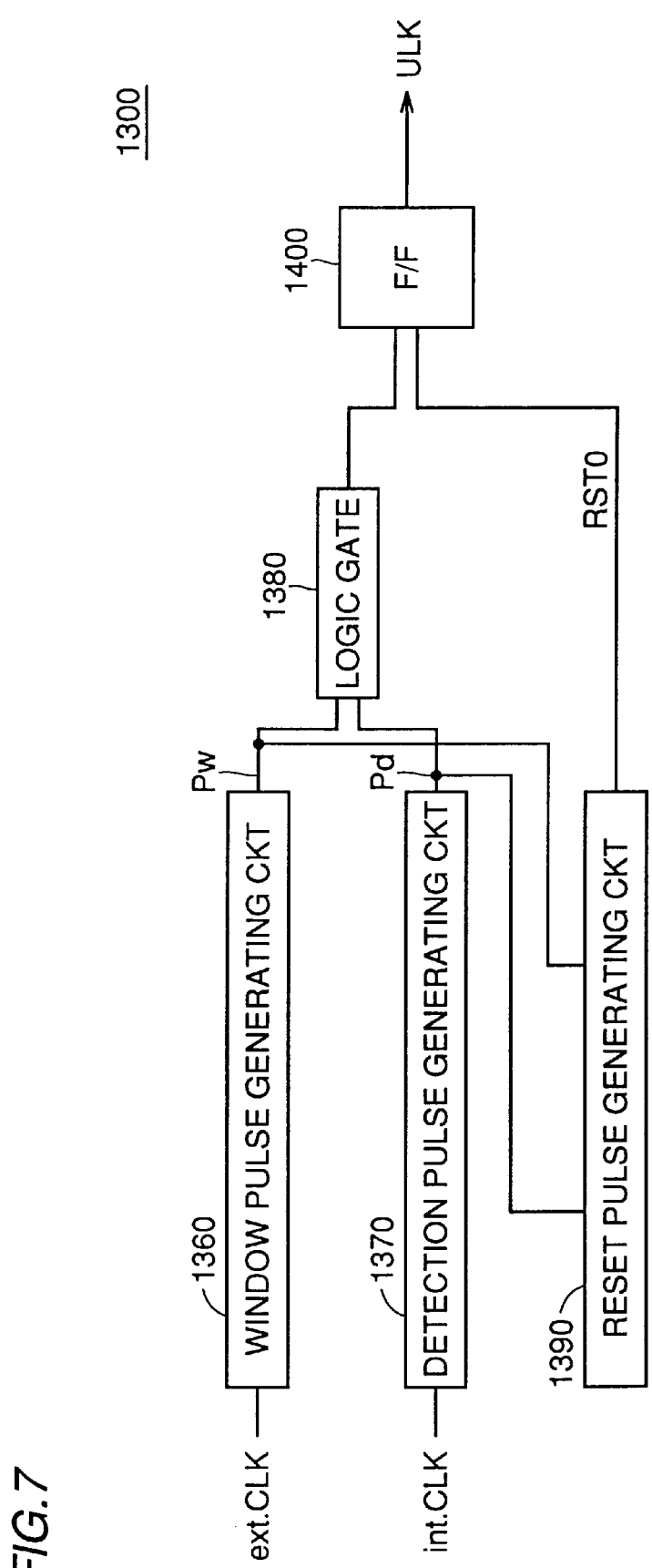
FIG. 7 is a schematic block diagram showing a configuration of the FIG. 5 unlocked-state detection circuit 1300.

FIG. 7 is a schematic block diagram showing a configuration of the FIG. 5 unlocked-state detection circuit 1300.

Unlocked-state detection circuit 1300 includes a window pulse generation circuit 1360 receiving external clock signal ext.CLK to generate a window pulse PW with a predetermined pulse width at each of rising and falling edges of external clock signal ext.CLK.

A pulsed signal generated at a rising edge of external clock signal ext.CLK will be referred to as a shot pulse SP1 and a pulse generated at a falling edge of external clock signal ext.CLK will be referred to as a shot pulse SP2.

Unlocked-state detection circuit 1300 also includes a detection pulse generation circuit 1370 receiving internal clock signal int.CLK from DLL circuit 1244 to output a pulse Pd for detection of locked state.

A pulse generated at a rising edge of internal clock signal int.CLK will be referred to as a shot pulse SP3 and a pulse generated at a falling edge of internal clock signal int.CLK will be referred to as a shot pulse SP4.

As will be described hereinafter, a pulse width of shot pulses SP3 and SP4 is set to be smaller in value than that of shot pulses SP1 and SP2 of window pulse Pw.

Unlocked-state detection circuit 1300 also includes a logic gate 1380 receiving signals Pw and Pd to output a low-level signal when detection pulse Pd is included in an active period of window pulse Pw and to output a high-level signal when detection pulse Pd is not included in an active period of window pulse Pw.

In response to a signal output from logic gate 1380, a flip-flop circuit 1400 has an output level set. When flip-flop circuit 1400 is placed in set state, signal ULK goes high.

Unlocked-state detection circuit 1300 also includes a reset pulse generation circuit 1390 receiving signals Pw and Pd to generate a pulsed reset signal.

In response to a reset signal RSTO from reset pulse generation circuit 1390, a state of flip-flop circuit 1400 is reset and output signal ULK goes low.

More specifically, in response to reset pulsed-signal RSTO, flip-flop circuit 1400 is reset to output signal LOCK (of high level) indicative of normal locked state.

Figure 8:
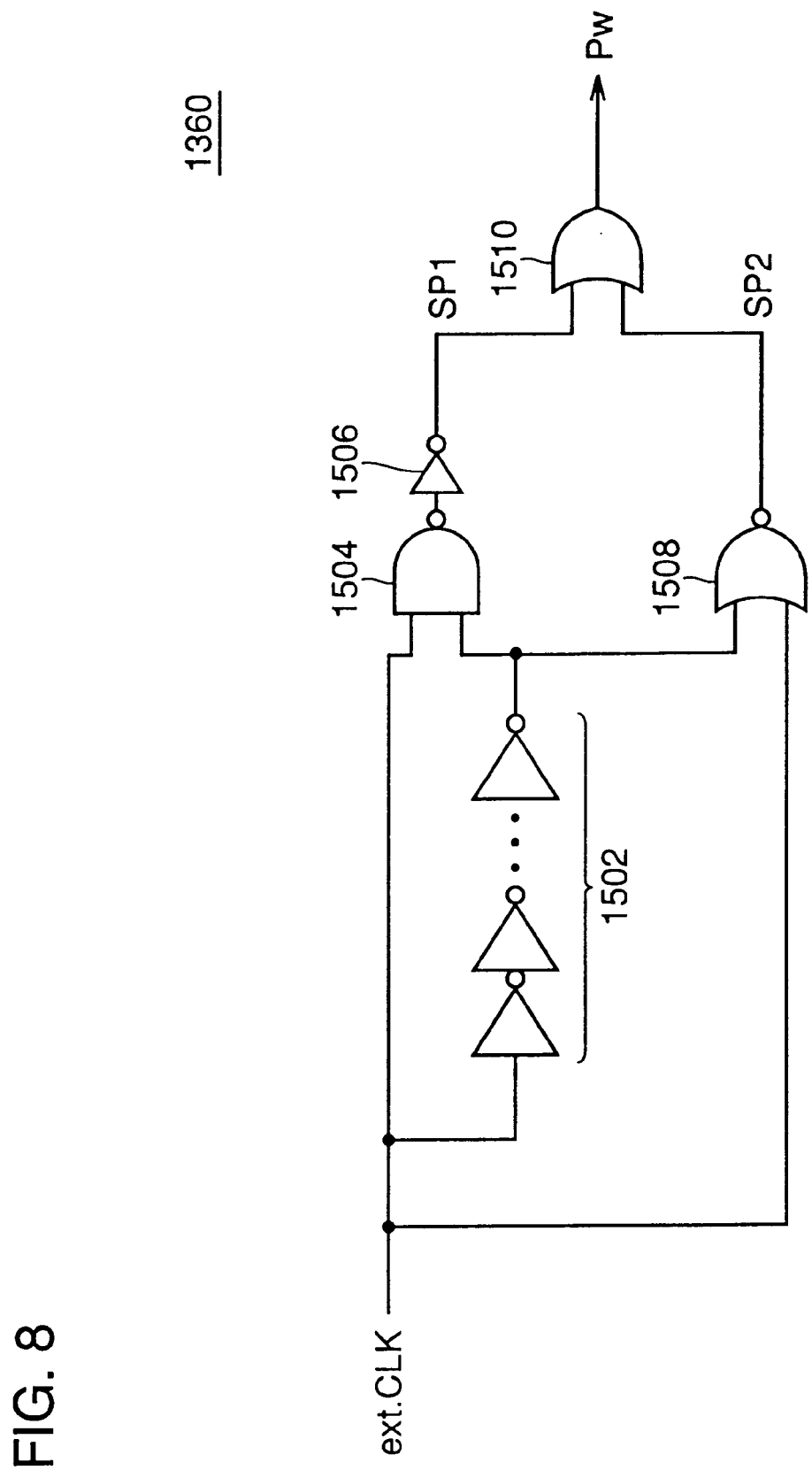
FIG. 8 is a schematic block diagram showing a configuration of the FIG. 7 window pulse generation circuit 1360.

FIG. 8 is a schematic block diagram showing a configuration of the FIG. 7 window pulse generation circuit 1360.

Window pulse generation circuit 1360 includes a train of inverters 1502 formed of inverters in an odd number of stages connected in series for receiving and delaying external clock signal ext.CLK for a predetermined period of time and then inverting it before it is output, an NAND circuit 1504 receiving an output from the train of inverters 1502 and external clock signal ext.CLK, an inverter 1506 receiving and inverting an output from NAND circuit 1504 to output signal SP1, an NOR circuit 1508 receiving the output from the train of inverters 1502 and external clock signal ext.CLK to output signal SP2, and an OR circuit 1510 receiving an output from inverter 1506 and an output from NOR circuit 1508 to output window pulse Pw.

Figure 9:
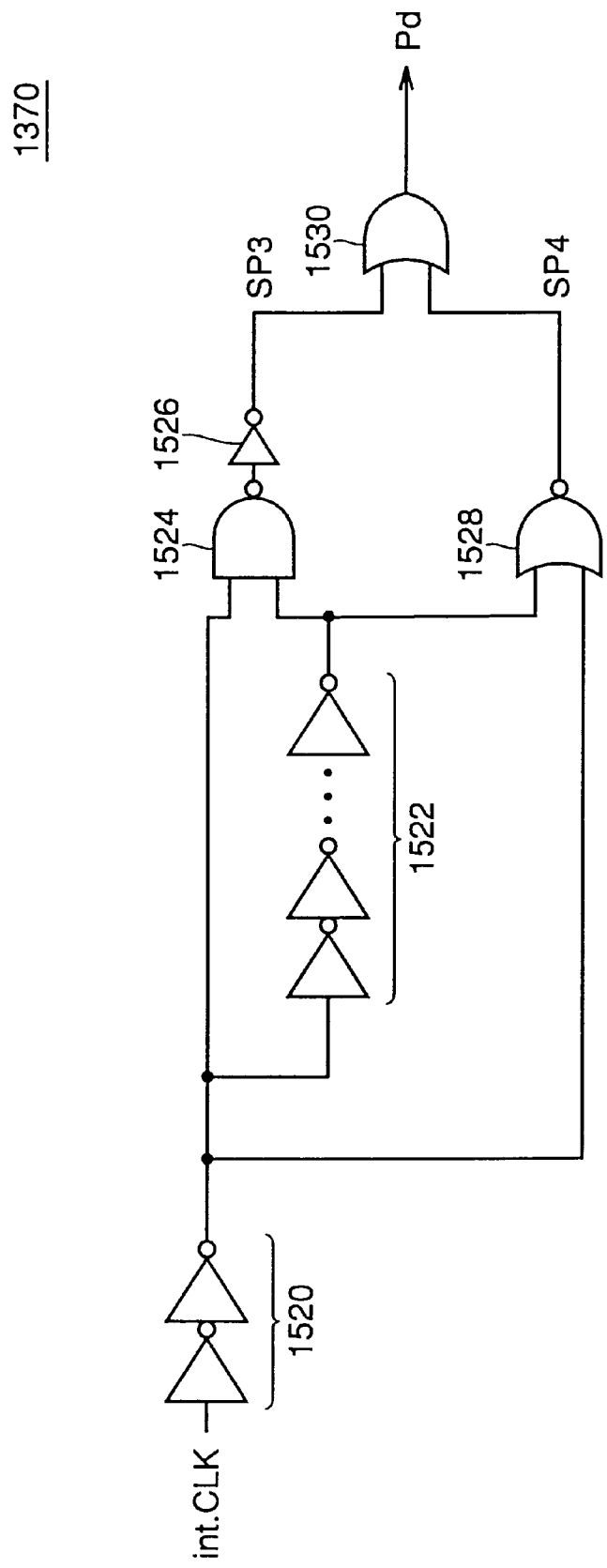
FIG. 9 is a schematic block diagram showing a configuration of the FIG. 7 detection pulse generation circuit 1370.

FIG. 9 is a schematic block diagram showing a configuration of the FIG. 7 detection pulse generation circuit 1370.

Detection pulse generation circuit 1370 includes a delay circuit 1520 receiving and delaying internal clock signal int.CLK for a predetermined period of time before it is output, a train of inverters 1522 formed of inverters in an odd number of stages connected in series, receiving and delaying an output from delay circuit 1520 for a predetermined period of time and also inverting it before it is output, an NAND circuit 1524 receiving an output from the train of inverters 1522 and the output from delay circuit 1520, an inverter 1526 receiving and inverting an output from NAND circuit 1524 to output signal SP3, an NOR circuit 1528 receiving the output from delay circuit 1520 and the output from the train of inverters 1522 to output signal SP4, and an OR circuit 1530 receiving an output from inverter 1526 and an output from NOR circuit 1528 to output signal Pd.

The number of the stages of the train of inverters 1522 is adapted to be smaller than the (odd) number of the stages of the train of inverters 1502 in window pulse generation circuit 1360.

As will be described hereinafter, delay circuit 1520 is adapted to have such a time delay that in normal operation, detection pulse Pd is completely included within a pulse of window pulse 1360.

Figure 10:
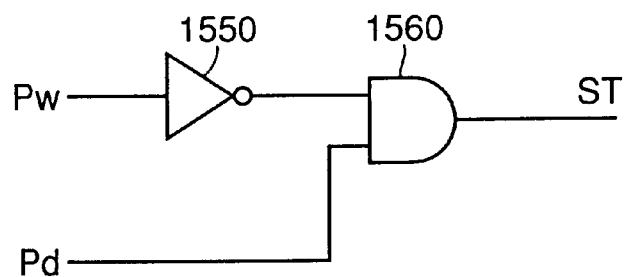
FIG. 10 is a circuit diagram showing a configuration of the FIG. 7 logic gate 1380.

FIG. 10 is a circuit diagram showing a configuration of the FIG. 7 logic gate 1380.

Logic gate 1380 includes an inverter 1550 receiving signal Pw, and an AND circuit 1560 receiving an output from inverter 1550 and signal Pd to output a signal ST for setting flip-flop circuit 1400.

Figure 11:
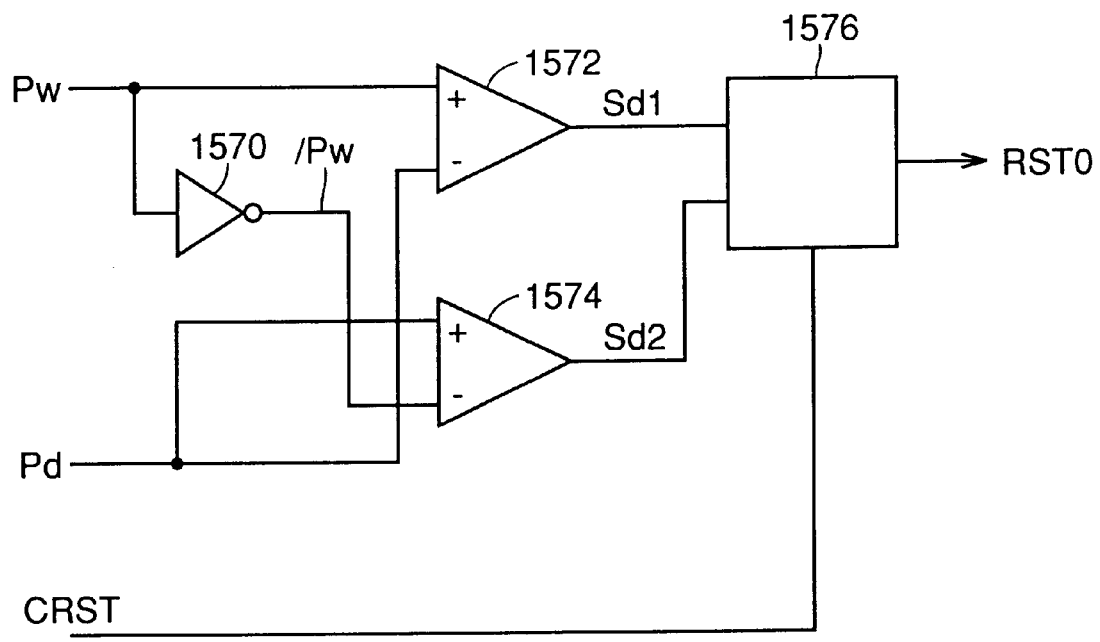
FIG. 11 is a schematic block diagram showing a configuration of the FIG. 7 reset pulse generation circuit 1390.

FIG. 11 is a schematic block diagram showing a configuration of FIG. 7 reset pulse generation circuit 1390.

Reset pulse generation circuit 1390 includes an inverter 1570 receiving signal Pw, a differential amplifier 1572 receiving signals Pw and Pd at positive and negative input nodes, respectively, and a differential amplifier 1574 receiving a signal /Pw output from inverter 1570 and signal Pd at negative and positive input nodes, respectively.

Reset pulse generation circuit 1390 also receives a signal Sd1 output from differential amplifier 1572 and a signal Sd2 output from differential amplifier 1574 as an inverted version of signal Sd1, and when it detects that signal Sd1 has varied twice it outputs a signal RST0 for resetting flip5 flop circuit 1400.

A counter 1576 is reset in response to a signal CRST activated for each falling edge of window pulse Pw.

Figure 12:
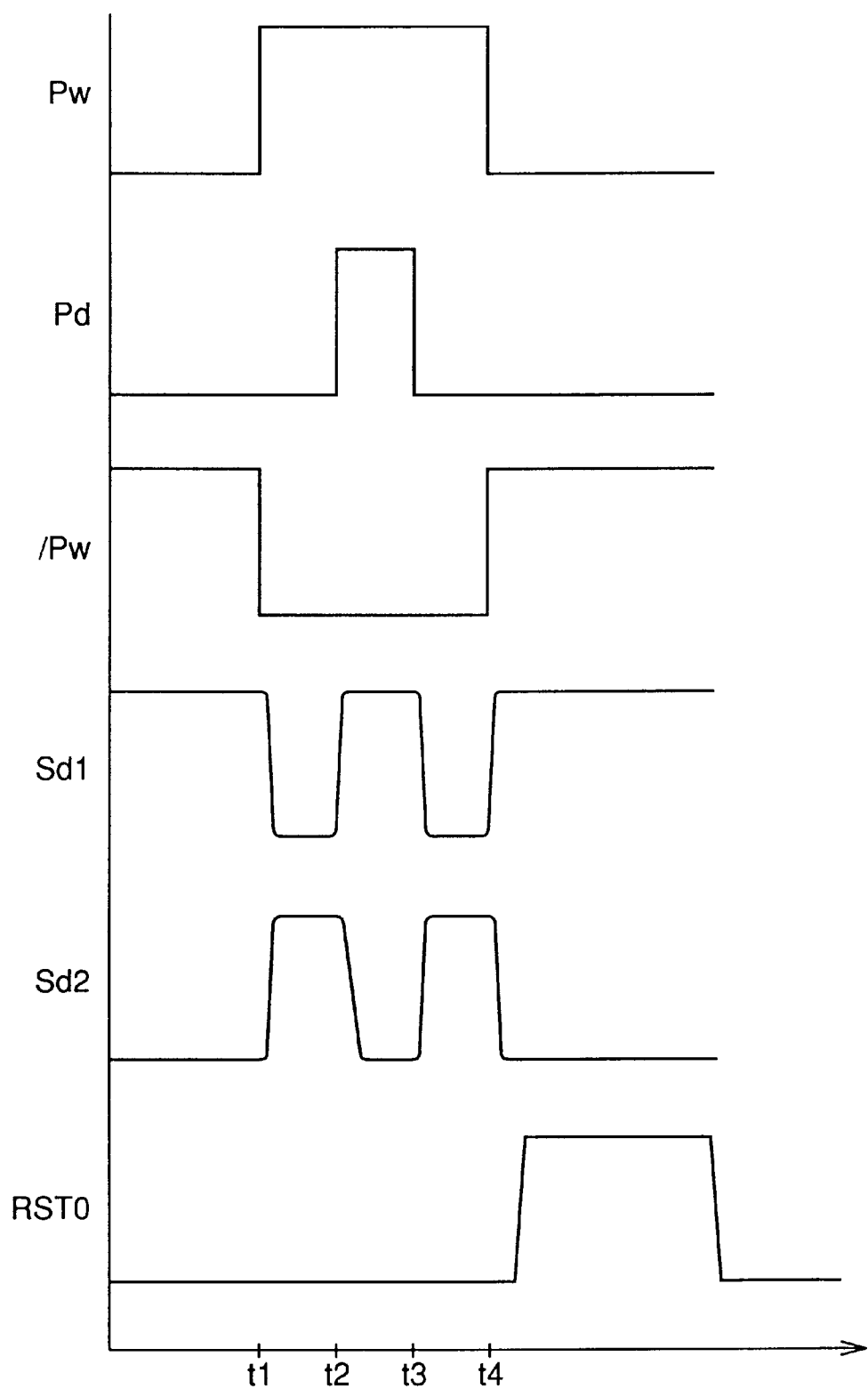
FIG. 12 is a timing chart for representing an operation of counter 1576.

FIG. 12 is a timing chart for representing counter 1576 operation.

FIG. 12 shows detection pulse Pd completely included within window pulse Pw, indicating that the synchronizing internal clock generation circuit operates normally.

At time t1, window pulse Pw rises to an active state, while signal /Pw goes low.

Also, in response to signal Pd, which is held low, signal Sd1 transitions decreasingly and signal Sd2 transitions increasingly.

When a delay time of delay circuit 1520 has elapsed since time t1 and time t2 has thus been counted, detection pulse Pd goes high.

Responsively, signal Sd1 increases and signal Sd2 decreases. In response to the increasing edge of signal Sd and the decreasing edge of signal Sd2, counter circuit 1576 increments a count of one.

Then in response to signal Pd going low at time t3, signal Sd1 transitions decreasingly and signal Sd2 transitions increasingly.

Then, in response to signals Pw and /Pw going low and high, respectively, at time t4, again signal Sd1 increases and signal Sd2 decreases.

In response to the transitions in level of signals Sd1 and Sd2, counter 1576 further increments a count of one. Responsively, signal RST0 transitions to be activated, going high.

According to the above description, an active period of pulsed signal Pd is completely included in an active period of signal Pw.

In this example, such a change in signals Sd1 and Sd2 that is counted by counter 1576 is caused twice, as has been described above.

Thus, reset signal RST0 responsively transitions to an active state.

If an active period of signal Pd is not completely included in an active period of signal Pw, the transition in signals Sd1 and Sd2 that is counted by counter 1576 is not caused twice and reset signal RST0 is not activated. Furthermore, the value of counter 1576 is reset in response to signal CRST activated when a predetermined period of time has elapsed since an inactivation edge of power signal Pw. Responsively, signal RSTO transitions low.

At the subsequent activation edge of signal Pw, however, counter 1576 starts count operation from a reset state.

Figure 13:
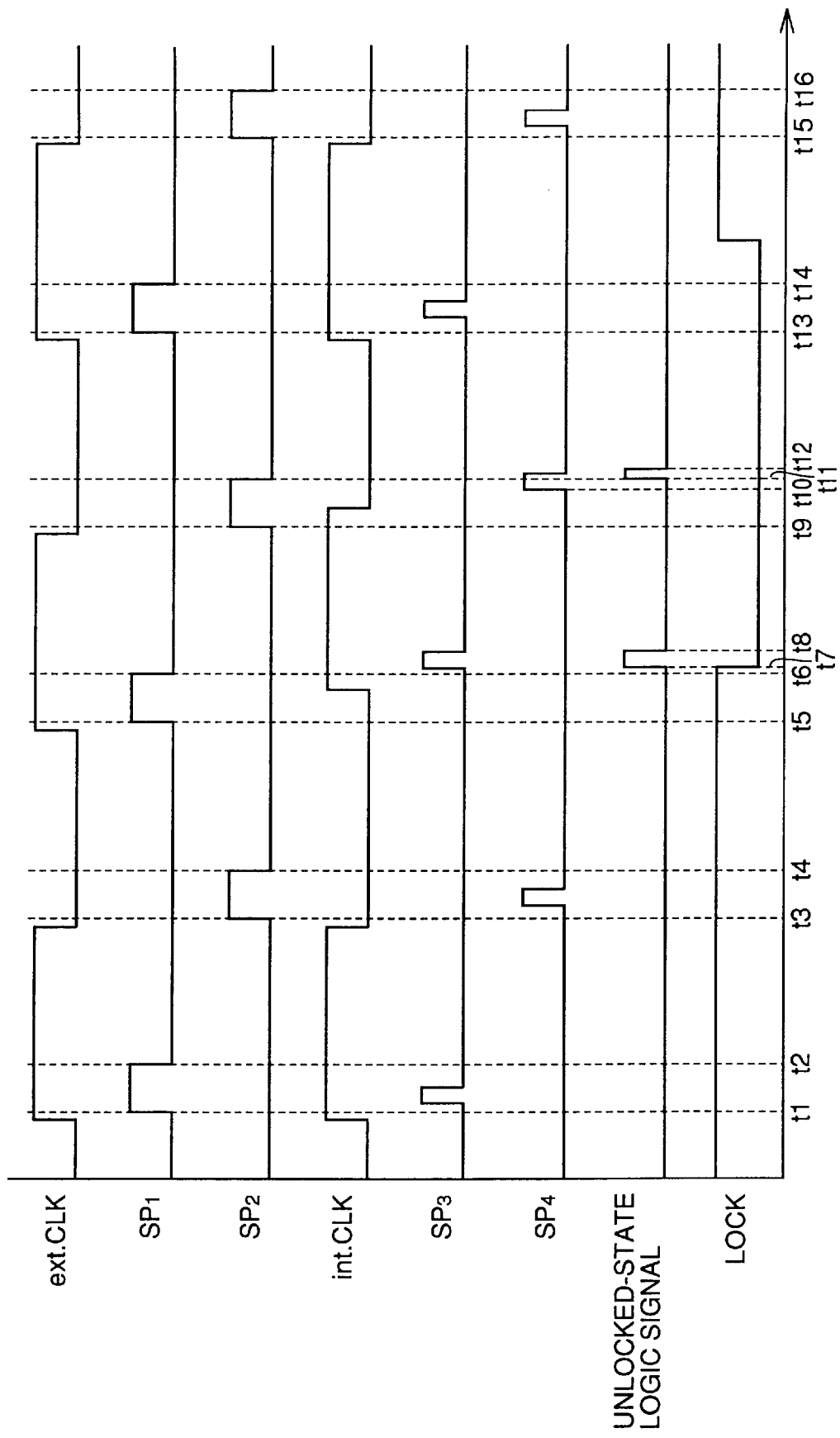
FIG. 13 is a timing chart for representing an operation of the FIG. 7 unlocked-state detection circuit 1300.
Figure 17:
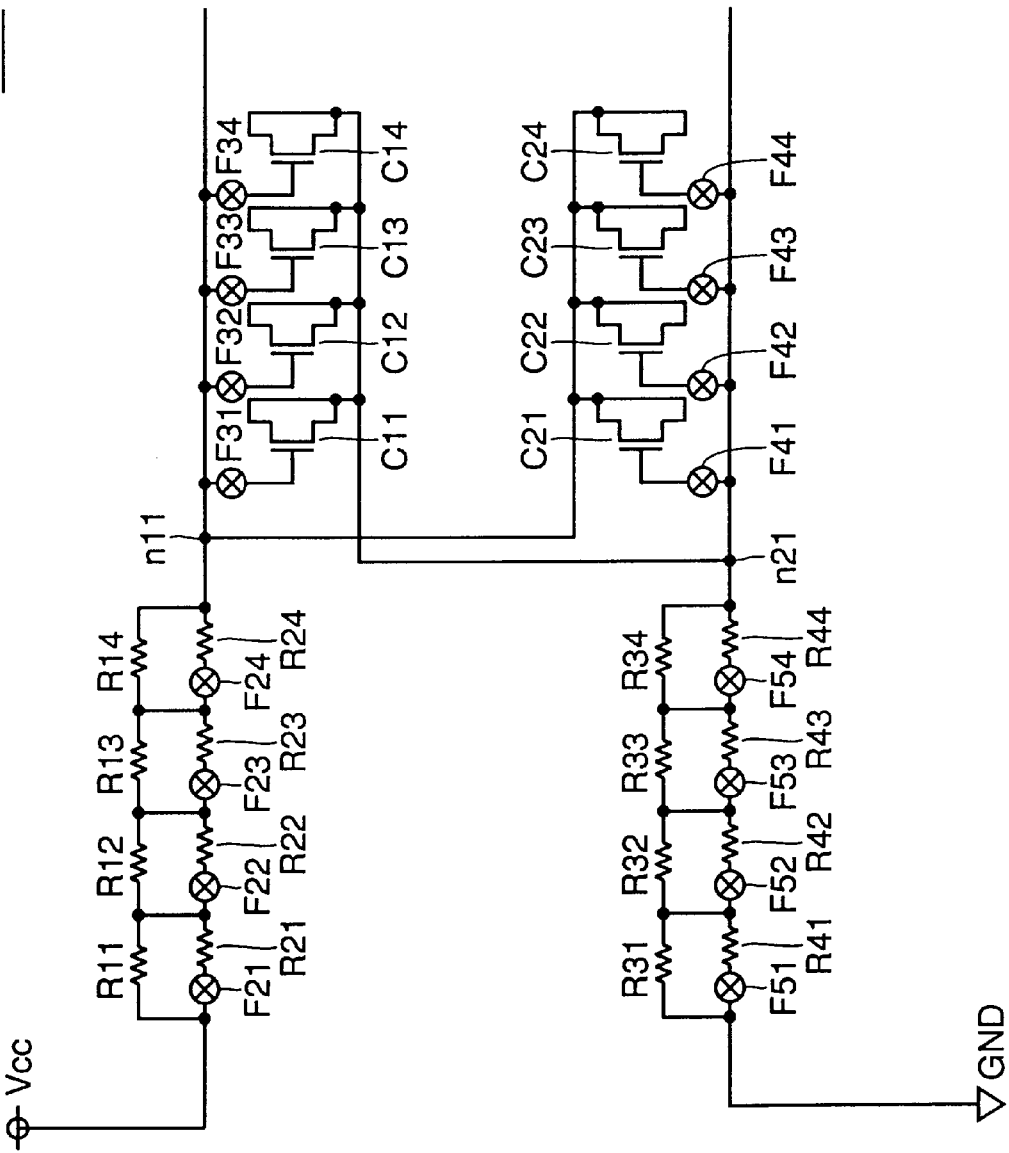
FIG. 17 is a circuit diagram for illustrating a configuration of the FIG. 16 power supply filter circuit 4010.

FIG. 13 is a timing chart for representing an operation of FIG. 17 unlocked-state detection circuit 1300.

The period from times t1 to t2 during which shot pulse SP1 generated in response to the rising edge of external clock signal ext.CLK at time t1, completely includes shot pulse SP3 generated in response to a rising edge of internal clock signal int.CLK. Thus, a signal output from logic gate 1380 is not activated during the period from times t1 to t2.

The above description also applies to the period from time t3 to t4.

Between times t5 and t6, an edge of external clock signal ext.CLK rising at times t5 fails to synchronize with a rising edge of internal clock signal int.CLK. Thus, shot pulse SP3 is not at all included in the active period of shot pulse SP1 between times t5 and t6.

In this case, an unlocked-state logic signal corresponding to a signal output from logic gate 1380 is held active from times t7 to t8.

Responsively, signal ULK output from flip-flop circuit 1400 goes high and signal LOCK goes low.

In a subsequent period from times t9 to t11 also, a falling edge of external clock signal ext.CLK fails to be synchronized with that of internal clock signal int.CLK.

Responsively, one shot pulse SP4 is held active outside an active period of shot pulsed signal SP2 (from times t11 to t12).

Thus the unlocked-state logic signal output from logic gate 1380 is held active during the period from times t11 to t12, although this signal does not change the state of flip-flop circuit 1400.

The rising edge of external clock signal ext.CLK at time t13 and that of internal clock signal int.CLK again recover to synchronized state.

Responsively, the active state of shot pulse SP1 from times t13 to t14 completely includes an active period of shot pulse SP3 generated in response to internal clock signal int.CLK activated.

Responsively reset pulse generation circuit 1390 generates reset pulse RST0, and responsively flip-flop circuit 1400 is reset and signal ULK transitions low.

Figure 14:
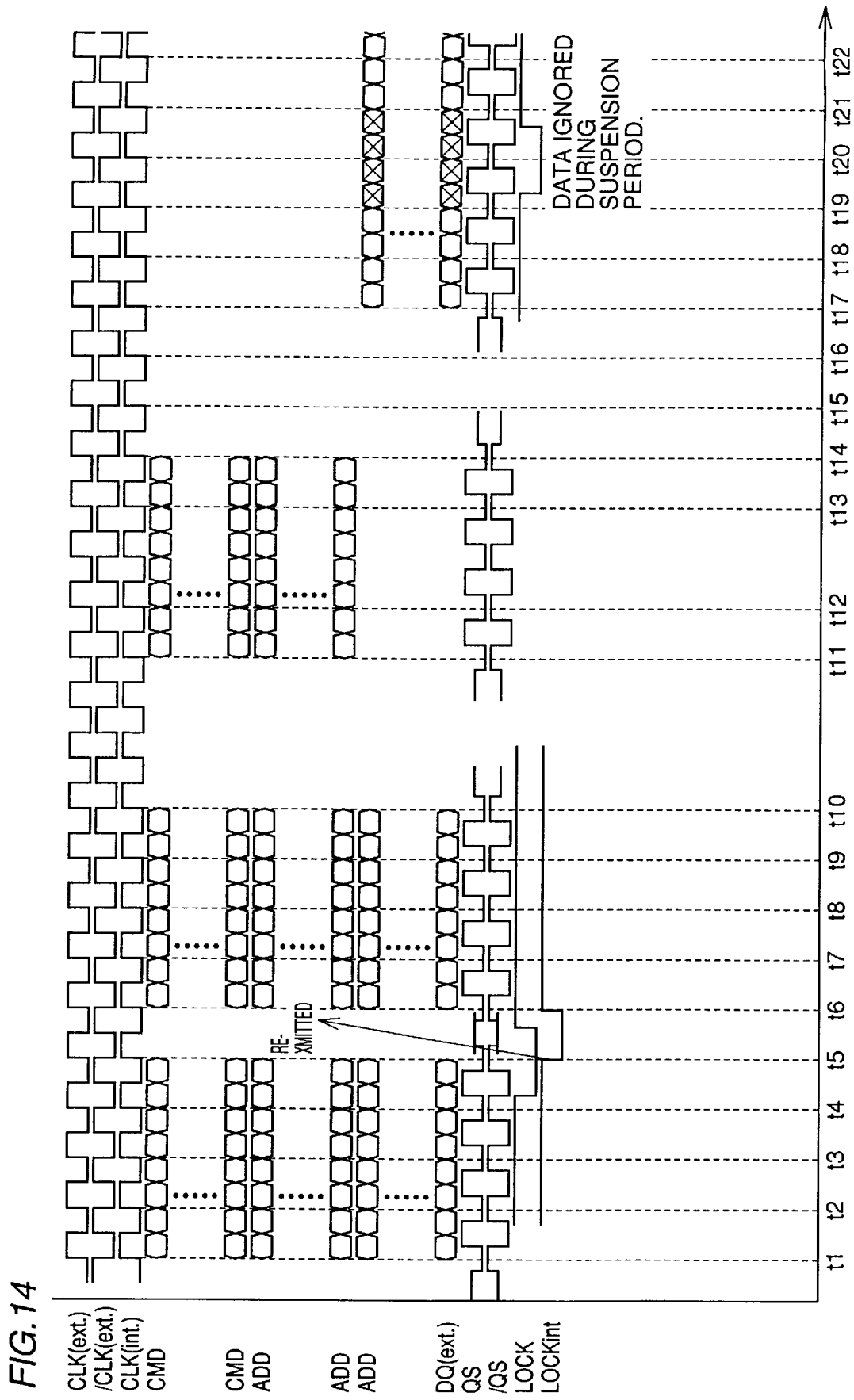
FIG. 14 is a timing chart representing a control waveform in the FIG. 3 memory system on the controller 3000 side.

FIG. 14 is a timing chart representing a control waveform in the FIG. 3 memory system on the controller 3000 side.

Controller 3000 outputs command signal CMD and address signal ADD over the period from times t1 to t5.

For example, when signal LOCK is detected to have transitioned low at time t4' the current locked condition of the chip side is assumed to be inappropriate and data is not assumed to be received normally.

Accordingly, after signal LOCK again goes back to a high level, command signal CMD and address signal ADD are again output to the chip side.

The memory chip 1000 side also ignores any command input when the locked condition of the synchronous internal clock is inappropriate. After the inappropriate locked condition recovers to normal, command signal SMD retransmitted is received.

Data from SDRAM chip 1000 is received when a predetermined latency has elapsed since transmission of a read command from controller 3000 to SDRAM 1000. If a locked condition is inappropriate during data transmission from memory chip 1000, data to be transmitted while the phases are unlocked is retransmitted from SDRAM 1000 to controller 3000.

The controller 3000 side also ignores data input duling the inappropriate locked period from times t19 to t21, and receives data after locked state is again recovered.

In FIG. 14, clock transmission between SDRAM 1000 and controller 3000 requires a time corresponding e.g. two clock cycles. After a command is transmitted, controller 3000 monitors signal LOCK for the time of two clock cycles, and assumes that the command has been transmitted normally unless a locked condition is detected to be inappropriate.

Figure 15:
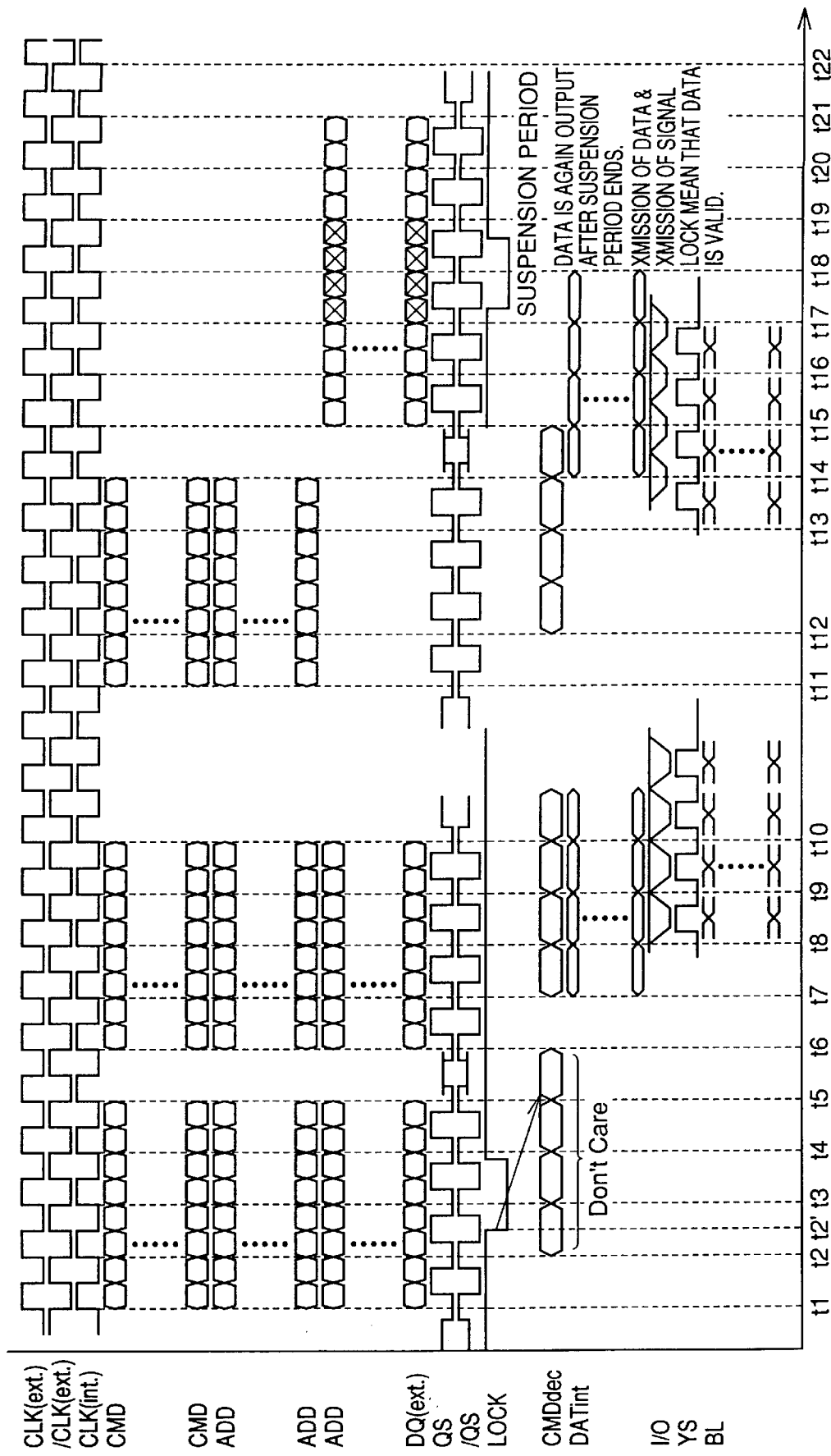
FIG. 15 is a timing chart representing a waveform of operation on the SDRAM 1000 side.

FIG. 15 is a timing chart representing an operation waveform on the SDRAM 1000 side, as compared with FIG. 14.

SDRAM 1000 also ignores any command input during a period associated with an inappropriate locked condition detected, e.g., at time t2'.

After the locked condition recovers to normal, SDRAM 1000 receives a command provided after time t7 as a normal command to start outputting read data.

If a locked condition becomes inappropriate when data is being output, outputting data is suspended. Outputting data is resumed after the locked condition recovers to normal.

With the configuration described above, command and data communication is provided in a memory system only when an internal clock signal in SDRAM 1000 is operating normally. Thus, data communication error due to system noise or the like can be avoided.

According to the above description, a synchronizing internal clock generation circuit allows a DLL circuit to generate internal clock signal int.CLK synchronized with external clock signal ext.CLK.

However, the configuration of the synchronized clock signal generation circuit is not limited to the above configuration and may be configured e.g. using a phase locked loop (PLL) circuit.

It should be noted that while the above description is provided exemplifying a system using an SDRAM, it is applicable to other synchronous systems. More specifically, the present invention is characterized in configuration that since in a synchronous system that out-of-sync state with respect to a synchronous clock which is detected to be great significantly affects the reliability of the system, any instruction provided when an out-of-sync state is caused is ignored and the processes associated with the instruction are again performed after a synchronized state is recovered so as to enhance the reliability of the system, and this characteristic configuration of the present invention is applicable to other systems.

While the above description has been provided with respect to a system between separated devices, i.e., a controller and a chip, the characteristic configuration of the present invention is similarly applicable to constructing a system on a single chip.

[Second Embodiment]

Figure 16:
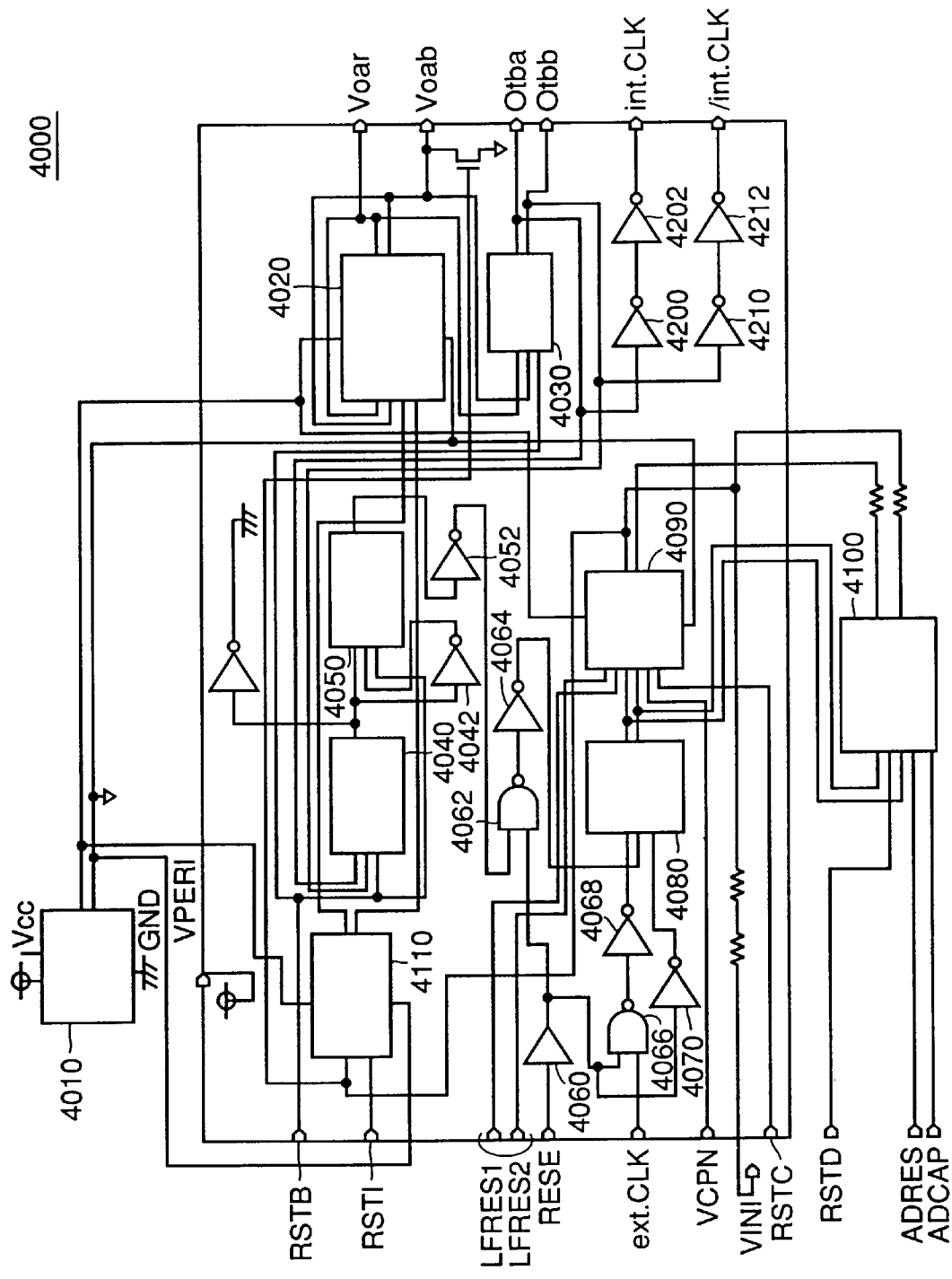
FIG. 16 is a schematic block diagram for illustrating a configuration of a synchronizing internal clock generating circuit 4000 according to a second embodiment of the present invention.

FIG. 16 is a schematic block diagram for illustrating a configuration of synchronizing internal clock generating circuit 4000 according to a second embodiment of the present invention, providing a timing chart representing a waveform of operation on the SDRAM 1000 side.

As will be apparent from the description provided below, synchronizing internal clock generating circuit 4000 generates synchronizing internal clock signal int.CLK via a PLL circuit.

Using a PLL circuit allows generation of internal clock signal int.CLK higher in frequency than external clock signal ext.CLK.

Referring to FIG. 16, synchronizing internal clock generating circuit 4000 includes a power supply filter 4010 receiving a power supply Vcc for removal of noise thereof, a ring oscillator 4020 using a power supply voltage supplied from power supply filter 4010 to transmit a signal with a small amplitude to thereby oscillate, an output buffer 4030 receiving an output from ring oscillator 4020 and converting the signal of the small amplitude in a signal level of full swing, a frequency divider 4040 receiving an output from output buffer 4030 for frequency division, an inverter 4042 receiving an output from frequency divider 4040, a frequency divider receiving an output from inverter 4042 and the output from frequency divider 4040 for further frequency division, an inverter 4052 receiving an output from frequency divider 4050, an NAND circuit 4062, receiving an output from inverter 4052 and a reset signal RESE supplied via an input buffer 4060, and an inverter 4064 receiving an output from NAND circuit 4062.

Synchronizing clock generating circuit 4000 also includes an NAND circuit 4066 receiving reference clock signal ext.CLK externally applied and the reset signal from input buffer 4060, an inverter 4068 receiving and inverting an output from NAND circuit 4066, an inverter 4070 inverting and outputting the reset signal output from input buffer 4060, a phase comparator 4080 receiving respective outputs from inverters 4064, 4068 and 4070 and receiving a signal corresponding to external clock signal ext.CLK from inverter 4068 and a signal obtained by dividing internal clock signal int.CLK from inverter 4064 in frequency to compare the phases of the both signals with each other, a charge pump circuit 4090 operating on a power supply VCPN and for charge pump current, receiving an output from phase comparator 4080 and reset in response to reset signal RSTC, a rapid lock circuit 4100 receiving an output from phase comparator 4080, operating on DC potentials RDES and ADCAP and reset in response to a reset signal RSTD, and a voltage-current conversion circuit 4110 receiving a voltage VLF depending on an output from charge pump circuit 4090 and an output from rapid lock circuit 4100 and converting it in a predetermined level of current.

Ring oscillator 4020 oscillates at a delay time corresponding to a value of current from voltage-current conversion circuit 4110.

Synchronizing internal clock generating circuit 4000 also includes a train of inverters 4200 and 4202 receiving an output from output buffer 4030 to output one of internal, complementary clock signals, and a train of inverters 4210 and 4212 receiving an output from output buffer 4030 to output the other of the internal, complementary clock signals.

FIG. 17 is a circuit diagram for illustrating a configuration of the FIG. 16 power supply filter circuit 4010.

Power supply filter circuit 4010 includes fuse elements F21 to F24 connected between power supply Vcc and a node N11 such that they are successively paired and connected alternately, and resistors R21 to R24. A resistor R11 is connected in parallel with a pair of fuse element F21 and resistor R21, a resistor R12 is connected in parallel with a pair of fuse element F22 and resistor R22, a resistor R13 is connected in parallel with a pair of fuse element F23 and resistor R23, and a resistor R14 is connected in parallel with a pair of fuse element F24 and resistor R24.

Power supply filter circuit 4010 also includes MOS capacitors C11 to C14 connected in parallel with one another between node n11 and a node n21. Node n11 is selectively connected or disconnected to each of MOS capacitors C11 to C14 via fuse elements F31 to F34.

Power supply filter 4010 also includes MOS capacitors C21 to C24 connected in parallel with one another between nodes n11 and n21.

MOS capacitors C21 to C24 is selectively connected or disconnected to node N21 via fuse elements F41 to F44, respectively.

Power supply filter circuit 4010 include includes resistors R31 to R34 and fuse elements F51 to F54 connected between node N21 and ground potential GND in a similar manner to fuse elements F21 to F24 and resistors R1 to R24.

Figure 18:
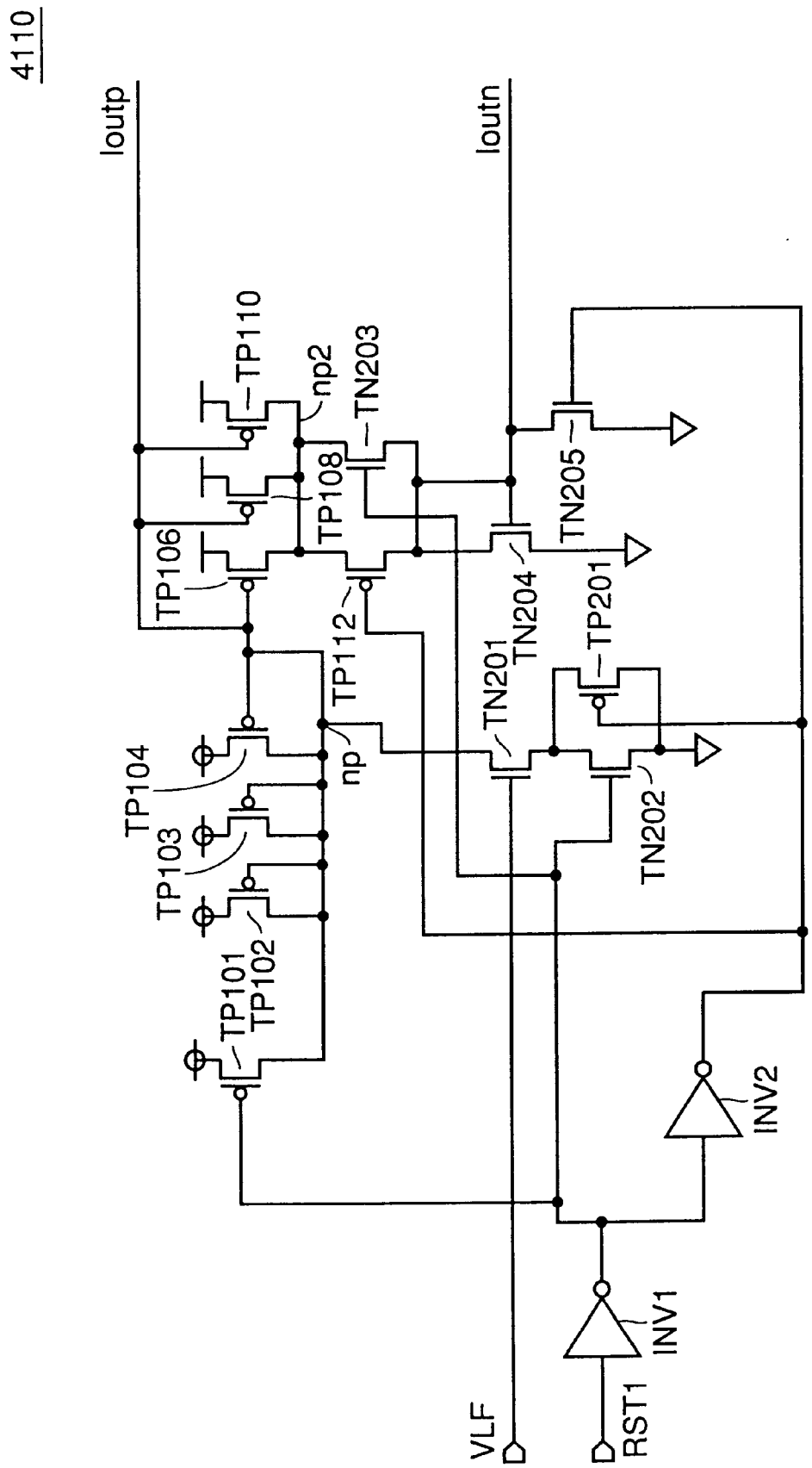
FIG. 18 is a circuit diagram showing a configuration of the FIG. 16 voltage-current conversion circuit 4110.

FIG. 18 is a circuit diagram showing a configuration of the FIG. 16 voltage-current conversion circuit 4110.

Referring to FIG. 18, voltage-current conversion circuit 4110 includes an N-channel MOS transistor TN201 having the gate receiving voltage VLF output from charge pump circuit 4090. Transistor TN201 is connected between an internal node np and a transistor TN202 having the source receiving ground potential GND and the gate receiving an output from an inverter INV1 receiving a reset signal RST1.

Transistor TN202 is connected in parallel with a P-channel MOS transistor TP201 having the gate receiving an output from an inverter INV2 receiving the output from inverter INV1.

Between internal node np and power supply potential Vcc is provided a P-channel MOS transistor TP 101 having the gate receiving the output from inverter INV1.

Between internal node np and power supply potential Vcc is also provided P-channel MOS transistors TP102 and TP103 which are diode-connected together.

A P-channel MOS transistor TP104 is also connected between power supply potential Vcc and internal node np. A transistor TP106 is also connected between an internal node np2 and power supply potential Vcc. Transistors TP104 and TP106 have their gates connected together and connecting transistor TP104 gate and internal node np together allows transistors TP104 and TP106 to form a current mirror circuit.

Between internal node np2 and power supply potential Vcc are also provided P-channel MOS transistors TP108 and TP110 having their respective gates connected to transistor TP104.

A gate potential of transistor TP104 is output as a signal Ioutp.

Voltage-current conversion circuit 4110 also includes a p-channel MOS transistor TP112 having the source connected to internal node np2 and the gate receiving an output from inverter INV2, an N-channel MOS transistor TN203 having the drain connected to internal node NP2 and the gate receiving the output from inverter INV1, and a transistor TN204 connected between transistor TP 112 drain and ground potential.

Transistor TN204 gate is connected to transistor TN204 drain and a potential level of transistor TN204 gate is output as a signal Ioutn.

Voltage-current converting circuit 4110 also includes an N-channel MOS transistor TN205 provided between transistor TN204 gate and ground potential and having the gate receiving the output from inverter INV2.

More specifically, in response to signal VLF, the current of a value that flows via transistor TN201 flows through transistors TP104 and TP106 configuring a current mirror circuit.

Figure 19:
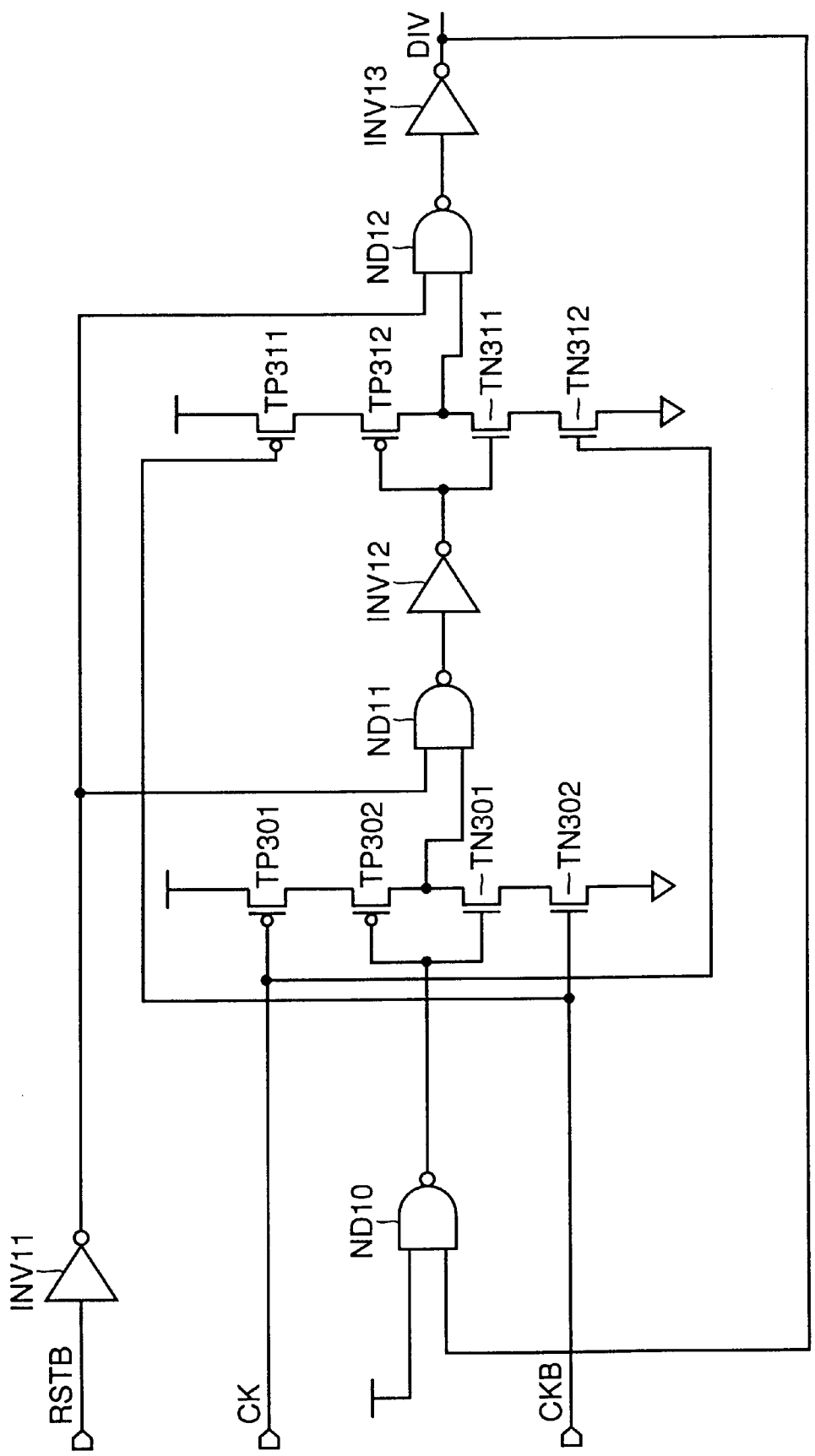
FIG. 19 is a schematic block diagram showing a configuration of the FIG. 16 frequency dividing circuit 4040.

FIG. 19 is a schematic block diagram showing a configuration of the FIG. 16 frequency dividing circuit 4040.

Frequency dividing circuit 4050 is basically similar in configuration to frequency dividing circuit 4040, except that signals input thereto and output therefrom are different.

Frequency dividing circuit 4040 includes an inverter INVL1 receiving a rest signal RSTB, an NAND circuit ND10 receiving a signal DIV output from frequency dividing circuit 4040 and power supply potential Vcc, and P-channel MOS transistors T0301 and TP302 and N-channel MOS transistors TN301 and TN302 connected in series between power supply potential Vcc and ground potential GND.

Transistor TP301 gate receives a clock signal CK and transistor TN302 gate receives a signal CKB corresponding to clock signal CK inverted.

Transistors TP302 and TN301 gates receive an output from NAND circuit ND 10.

It should be noted that the size (or gate width) of transistors TP301 and TP302 is adapted to have a larger value than the size of the respectively associated transistors TN301 and TN302.

More specifically, the sizes of the transistors are set such that a potential level of a connection node of transistors TP302 and TN301 is a high level when transistors TP301 and TP302 are ON.

Frequency dividing circuit 4040 also includes an NAND circuit ND11 having one input node receiving the potential level of the connection node of transistors TP302 and TN301 and having the other input node receiving the output from inverter INV11, an inverter INV12 receiving an output from NAND circuit ND11, and P-channel MOS transistors TP311 and TP312 and N-channel MOS transistors TN311 and TN302 connected in series between power supply potential Vcc and ground potential GND.

Transistors TP312 and TN311 gates receive an output from inverter INV12, transistor TP311 receives signal CKB, and transistor TN312 gate receives signal CK.

The size of transistors TP311 and TP312 is set to have a larger value than the size of transistors TN311 and TN312.

Frequency dividing circuit 4040 also includes an NAND circuit ND 12 having one input node receiving a potential of a connection node of P-channel MOS transistors TP312 and TN311 and the other input node receiving the output from inverter INV11, and an inverter INV13 receiving an output from NAND circuit ND12 and outputting signal DIV.

More specifically, when reset signal RSTB goes high, the output level of each of NAND circuits ND11 and ND12 is responsively reset high.

Responsively, output signal DIV goes low and the output from NAND circuit ND 10 goes high. Since the output of NAND circuit ND11 goes high in response to reset signal RSTB going high, the output from inverter INV12 goes low.

Responsively, transistors TP312 and TN311 are activated. Thus, when signal CKB goes low and signal CK goes high, a potential level of the connection node of transistors TP312 and TN311 responsively goes high.

At this time point, in response to a reset signal going low the output from inverter INV11 that is input to NAND circuit ND12 is held high. Thus, the output from NAND circuit ND12 goes low and the output from inverter INV13 goes high, and the output from NAND circuit ND10 goes low.

Responsively, transistors TP302 and TN301 are activated.

When signal CK goes low, the potential of the output node of transistors TP302 and TN301 goes high. Responsively, the output from inverter INV12 goes high. Thus, transistors TP312 and TN311 are inactivated. Thus, signal DIV rises in response to a rising edge of signal CK and signal DIV is also held high at the subsequent edge of signal CK.

Then, when signal CK rises and then again goes low, signal DIV also goes low.

In the series of operations as described above, a signal obtained by dividing mutually complementary signals CK and CKB by two in frequency.

The output from frequency dividing circuit 4040 is further divided in frequency dividing circuit 4050 by two in frequency and thus supplied to phase comparator circuit 4080.

Figure 20:
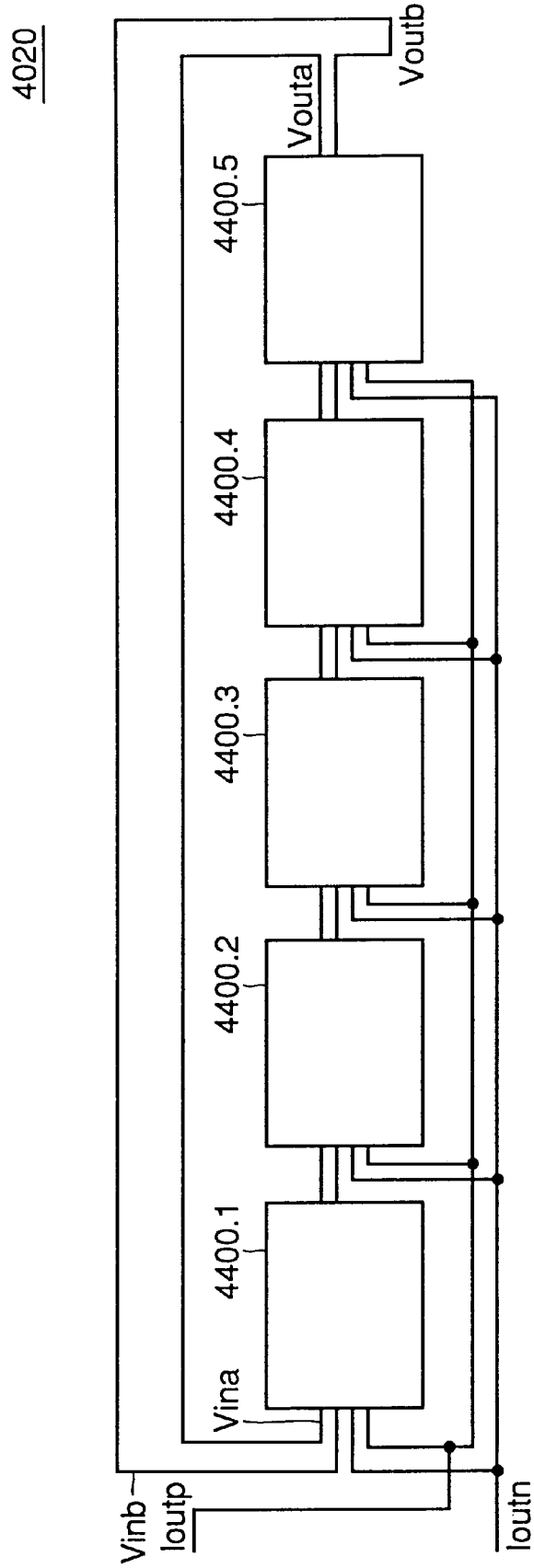
FIG. 20 is a schematic block diagram showing a configuration of a ring oscillator circuit 4020.

FIG. 20 is a schematic block diagram showing a configuration of ring oscillator circuit 4020.

Ring oscillator circuit 4020 operates on a power supply voltage from power supply filter 4010 and oscillates at a delay time depending on signals Ioutp and Ioutn from the voltage-current conversion circuit.

Within a closed circuit of the ring oscillator are included delay stages 4400.1 to 4400.5 connected in series.

Figure 21:
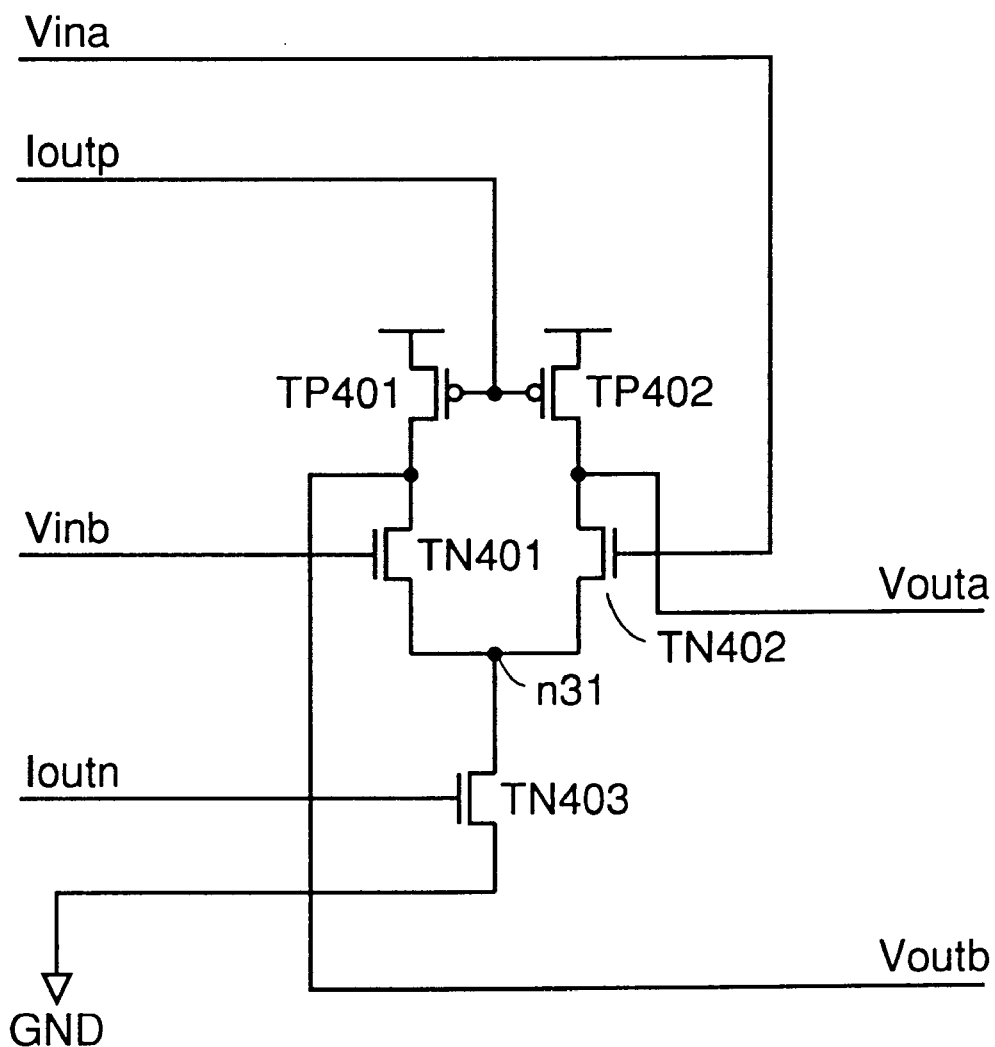
FIG. 21 is a circuit diagram for illustrating a configuration of the FIG. 20 delay stage 4400.1.

FIG. 21 is a circuit diagram for illustrating a configuration of FIG. 20 delay stage 4400.1.

Referring to FIG. 21, delay stage 4400.1 includes P-channel MOS transistors TP401 and TN402 connected in series between an internal node n31 and power supply potential Vcc, P- and N-channel MOS transistors TP402 and TN401 connected in series between power supply potential Vcc and internal node n31, and an N-channel MOS transistor TN403 connected between internal node n31 and ground potential GND and having the gate receiving signal Ioutn.

P-channel MOS transistors TP401 and TP402 gates are connected together and receive signal Ioutp.

Transistor TN402 receives a signal Vina input to delay stage 4400.1, and transistor TN401 gate receives signal Vinb input to delay stage 4400.1.

Figure 22:
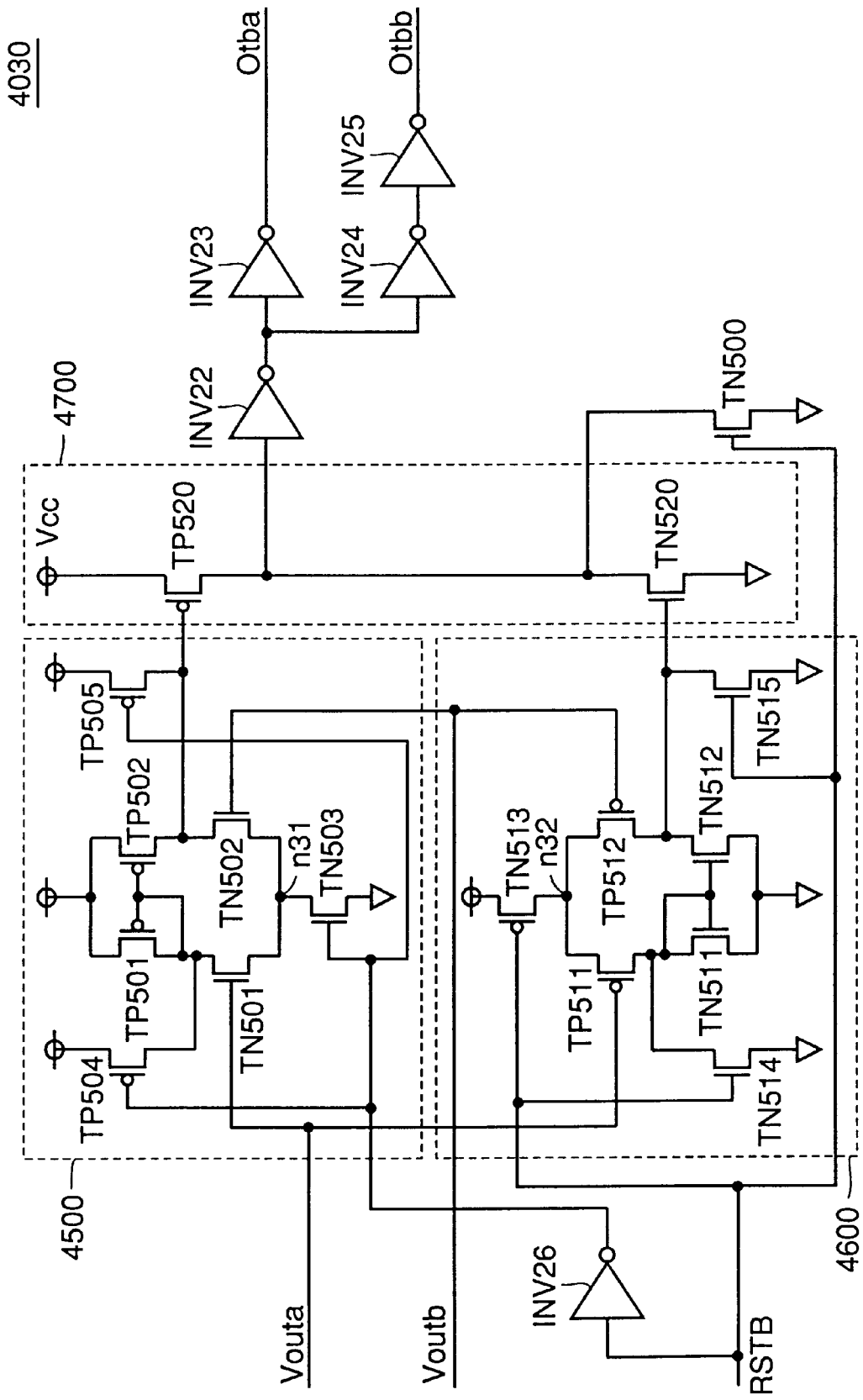
FIG. 22 is a schematic block diagram showing a configuration of an output buffer circuit 4030.

FIG. 22 is a schematic block diagram showing a configuration of output buffer circuit 4030.

Output buffer circuit 4030 receives a signal with a small amplitude from ring oscillator circuit 4020 and converts the received signal into a signal of full swing.

Output buffer circuit 4030 includes a differential amplification circuit 4500 receiving input signals Inba and Inbb and outputting a result obtained from differential amplification, a differential amplification circuit 4600 receiving signals Inba and Inbb in negative phase with respect to differential amplification circuit 4500 and outputting an amplification result, a buffer circuit 4700 outputting either a low- or high-level signal depending on the respective output levels of differential amplifiers 4500 and 4600, an inverter INV22 receiving and inverting an output from buffer circuit 4700, an inverter INV23 receiving an output from inverter INV22 and outputting an output signal Otba, an inverter INV24 receiving and inverting the output from inverter INV22, and an inverter INV25 receiving an output from inverter INV24 and outputting an output signal Otbb.

Output buffer circuit 4030 also includes an inverter INV26 receiving an inverting reset signal RSTB and outputting the inverted signal, and an N-channel MOS transistor TN500 coupling an output node of buffer circuit 4700 with ground potential GND in response to reset signal RSTB activated.

Differential amplification circuit 4500 includes P- and N-channel MOS transistors TP501 and TN501 connected in series between power supply potential Vcc an internal node n31, P- and N-channel MOS transistors TP502 and TN502 connected in series between power supply potential Vcc and internal node n31, and an N-channel MOS transistor TN503 connected between internal node n31 and ground potential GND and having the gate receiving an output from inverter INV26.

The gate and drain of transistor TP501 are connected together in series, and transistors TP501 and TP502, and TN501 and TN502 configure differential amplification circuit of current mirror type.

Differential amplification circuit 4500 also includes a transistor TP504 connected between power supply potential Vcc and a connection node of transistors TP501 and TN501 and having the gate receiving the output from inverter INV26, and a transistor TP505 coupled between power supply potential Vcc and a connection node of transistors TP502 and TN502 and having the gate receiving the output from inverter INV26.

Differential amplification circuit 4600 includes P- and N-channel MOS transistors TP511 and TN511 connected in series between ground potential GND and an internal node n32, P- and N-channel MOS transistors TP512 and TN512 connected in series between ground potential GND and internal node n31 and an N-channel MOS transistor TN513 connected between internal node n32 and power supply potential Vcc and having the gate receiving signal RSTB.

The gate and drain of transistor TN511 are connected together in series, and transistors TN511 and TN512, and TP511 and TP512 configure differential amplification circuit of current mirror type.

Differential amplification circuit 4600 also includes a transistor TP514 connected between ground potential GND and a connection node of transistors TP511 and TN511 and having the gate receiving signal RSTB, and a transistor TP515 connected between ground potential GND and a connection node of transistors TP512 and TN512 and having the gate receiving signal RSTB.

Buffer circuit 4700 includes P- and N-channel MOS transistors TP520 and TN520 connected in series between power supply potential Vcc and ground potential GND.

Transistor TP520 gate is connected to a connection node of transistors TP502 and TN502, and transistor TN520 gate is connected to a connection node of transistors TP512 and TN512.

Figure 23:
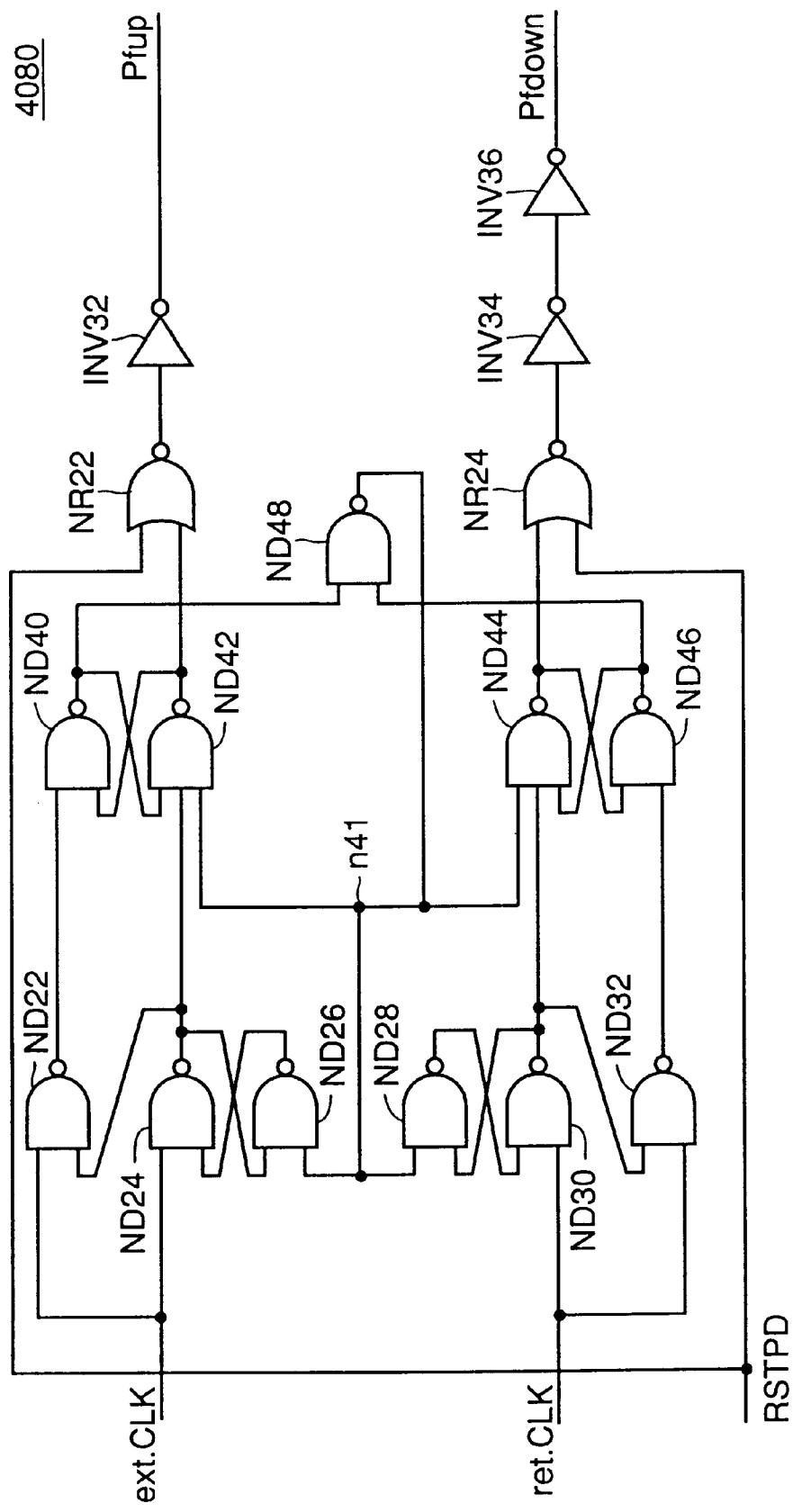
FIG. 23 is a circuit diagram for illustrating a configuration of the FIG. 16 phase comparator 4080.

FIG. 23 is a circuit diagram for illustrating a configuration of FIG. 16 phase comparator 4080.

Referring to FIG. 23, phase comparator 4080 includes an NAND circuit ND22 having one input node receiving external clock signal ext.CLK, an NAND circuit ND24 having one input node receiving the external clock signal, and an NAND circuit ND26 having one input node receiving an output from NAND circuit ND24 and the other input node receiving a potential level of an internal node n41.

NAND circuit ND24 has the other input node receiving an output from NAND circuit ND26, and NAND circuit ND22 has the other input node receiving the output from NAND circuit ND24.

Phase comparator 4080 also includes an NAND circuit ND40 having one input node receiving the output from NAND circuit ND22, and a 3-input NAND circuit ND42 having a first input node receiving an output from NAND circuit ND40, a second input node receiving the output from NAND circuit ND24 and a third input node receiving the potential level of internal node n41.

Phase comparator 4080 also includes an NAND circuit ND32 having one input node receiving a signal ref.CLK obtained after internal clock signal int.CLK is divided in frequency by frequency dividing circuits 4040 and 4050, an NAND circuit ND30 having one input node receiving signal ref.CLK, and an NAND circuit ND28 having one input node receiving an output from NAND circuit ND30 and the other input node receiving the potential level of internal node n41.

NAND circuit ND30 has the other input node receiving an output from NAND circuit ND28, and NAND circuit ND32 has the other input node receiving the output from NAND circuit ND30.

Phase comparator 4080 also includes an NAND circuit ND46 having one input node receiving an output from NAND circuit ND32, and a 3-input NAND circuit ND44 having a first input node receiving an output from NAND circuit ND46, a second input node receiving the output from NAND circuit ND30 and a third input node receiving the potential level of internal node n41.

Phase comparator 4080 also includes an NAND circuit ND48 receiving the respective outputs from NAND circuits ND40 and ND46 and having an output node connected to internal node n41, an NOR circuit NR22 having one input node receiving an output from NAND circuit ND42 and the other input node receiving reset signal RSTD, an inverter INV32 receiving and inverting an output from NOR circuit NR22 and outputting a signal pfup, an NOR circuit NR24 having one input nor receiving an output from NAND circuit ND44 and the other input node receiving signal RSTD, and inverters INV34 and INV36 receiving and successively inverting an output from NOR circuit NR24.

An output from inverter INV36 is output as a signal pfdown.

Figure 24:
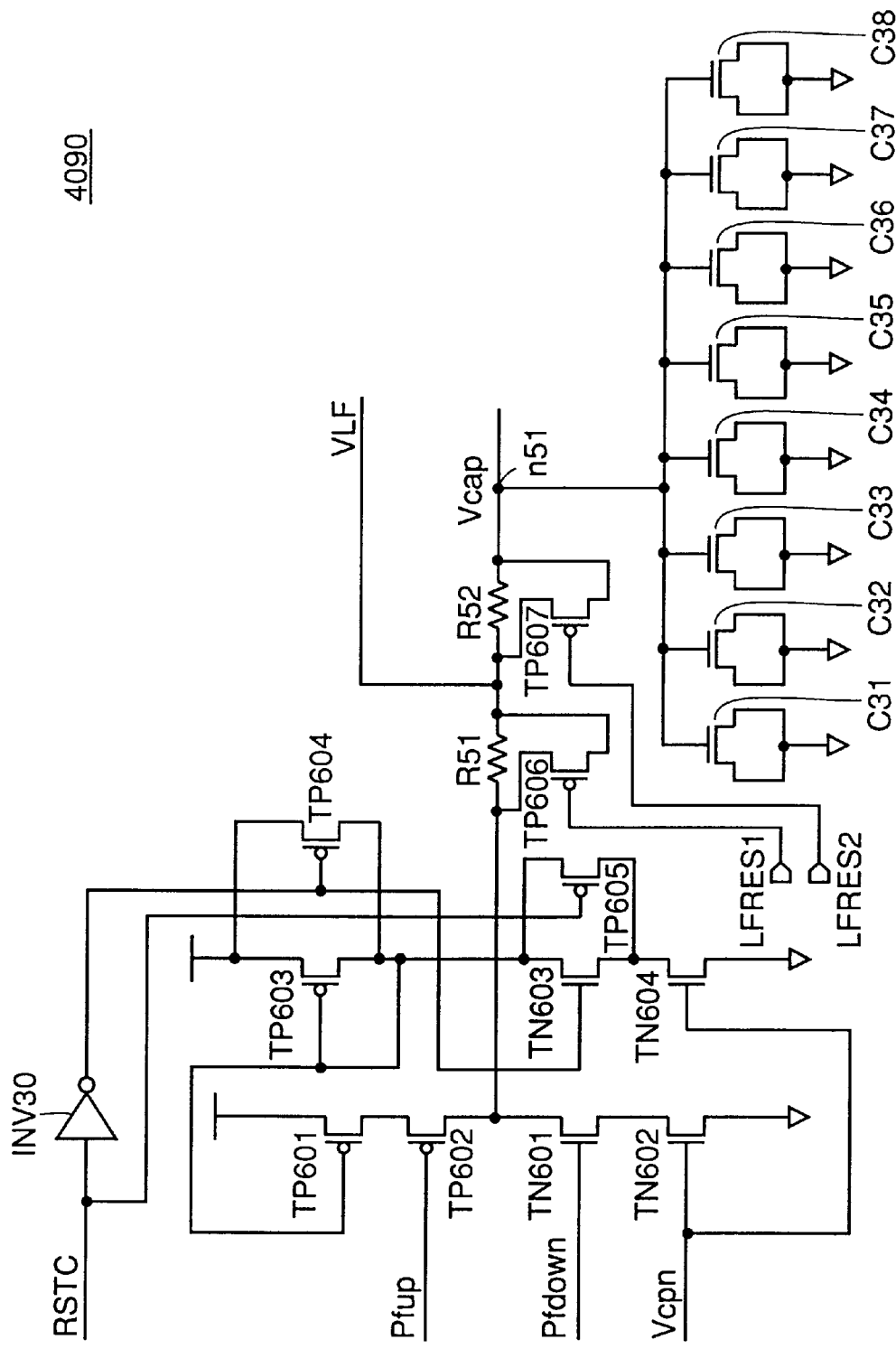
FIG. 24 is a schematic block diagram for illustrating a configuration of the FIG. 16 charge pump circuit 4090.

FIG. 24 is a schematic block diagram for illustrating a configuration of FIG. 16 charge pump circuit 4090.

Charge pump circuit 4090 includes an inverter INV30 receiving reset signal RSTC, and P-channel MOS transistors TP601 and TP602 and N-channel MOS transistors TN601 and TN602 connected in series between power supply potential Vcc and ground potential GND.

Transistor TP602 gate receives a signal UP from phase comparator 4080 and transistor TNG01 gate receives a signal DOWN from phase comparator 4080.

Transistor TN602 gate receives a signal Vcpn indicative of initiation of charge pump circuit operation.

Charge pump circuit 4090 also includes a P-channel MOS transistor TP602 and N-channel MOS transistors TN603 and TN604 connected in series between power supply potential Vcc and ground potential GND.

Transistor TN604 gate receives signal Vcpn.

Transistor TP603 gate is connected to transistor TP601 gate and transistor TP603 drain.

Transistor TN603 gate receives an output from inverter INV30.

Charge pump circuit 4090 also includes a P-channel MOS transistor TP604 connected in parallel with transistor TP603 and having the gate receiving the output from inverter INV30, and a P-channel MOS transistor TP605 connected in parallel with transistor TN603 and having the gate receiving signal RSTC.

Charge pump circuit 4090 also includes resistors R51 and R52 connected in series between an internal node n51 and a connection node of transistors TP602 and TN601.

A potential of a connection node of resistors R51 and R52 is output as a signal VLF.

Charge pump circuit 4090 also includes a P-channel MOS transistor TP606 connected in parallel with resistor R51 and having the gate receiving a loop filter reset signal LFRES1, a P-channel MOS transistor TP607 connected in parallel with resistor R52 and having the gate receiving a loop filter reset signal RFRES2, and MOS capacitors C31 to C38 connected in parallel with one another between node n51 and ground potential GND.

Node n51 receives a signal Vcap from the rapid lock circuit 4100 described hereinafter.

With the configuration described above, MOS capacitors C31 to C38 are charged every time signal UP is input, and capacitors C31 to C38 are discharged every time signal DOWN is input.

Figure 25:
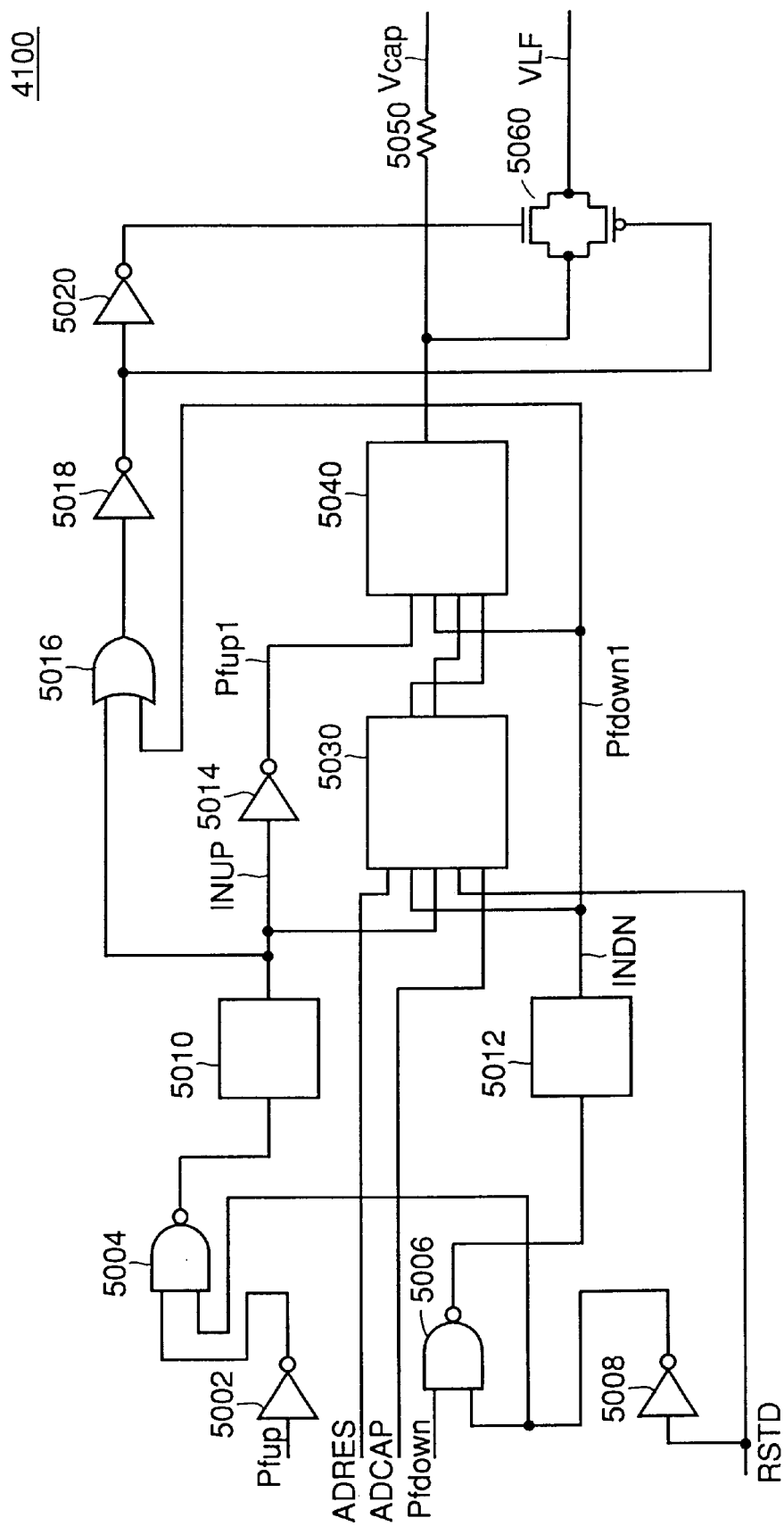
FIG. 25 is a schematic block diagram for illustrating a configuration of the FIG. 16 rapid lock circuit.

FIG. 25 is a schematic block diagram for illustrating a configuration of FIG. 16 rapid lock circuit.

As will be apparent from the description provided hereinafter, rapid lock circuit 4100 can boost an initial operating current of ring oscillator 4020 by increasing charge pump current in accordance with the phase difference between reference clock signal ext.CLK and internal clock signal int.CLK and consequently increasing the level of signal VLF.

Referring to FIG. 25, rapid lock circuit 4100 includes an inverter 5002 receiving signal UP from phase comparator 4080, an inverter 5008 receiving reset signal RSTD, an NAND circuit 5004 receiving an output from inverter 5002 and an output from inverter 5008, a waveform shaping circuit 5010 receiving an output from NAND circuit 5004 and shaping the received output into a waveform having a predetermined pulse-width, an NAND circuit 5006 receiving signal DOWN from phase comparator 4080 and the output from inverter 5008, a waveform shaping circuit 5012 receiving an output from AND circuit 5006 and converting the received output into a signal having a predetermined pulse-length, a variable current supply 5030 receiving outputs from waveform shaping circuits 5010 and 5012 to vary a value of current output, and a charge pump circuit 5040 operating in response to an output from variable current supply 5030.

Variable current supply 5030 is reset by reset signal RSTD and controlled by control signals ADRES and ADCAP.

Charge pump circuit 5040 also receives an output from waveform shaping circuit 5012 and a signal output from waveform shaping circuit and inverted by inverter 5014.

An output from charge pump circuit 5040 is output as an output signal Vcont via a resistor 5050 and supplied to node n51 in charge pump circuit 4090.

When an output from an OR circuit 5016 receiving the outputs from waveform shaping circuits 5010 and 5012 goes high, a transfer gate 5060 controlled by an inverter 5018 receiving the output from OR circuit 5016 and an inverter 5020 receiving an output from inverter 5018 turns on and the output level of charge pump circuit 5040 is supplied to the connection node of resistors R51 and R52 of the FIG. 24 charge pump circuit 4090.

Figure 26:
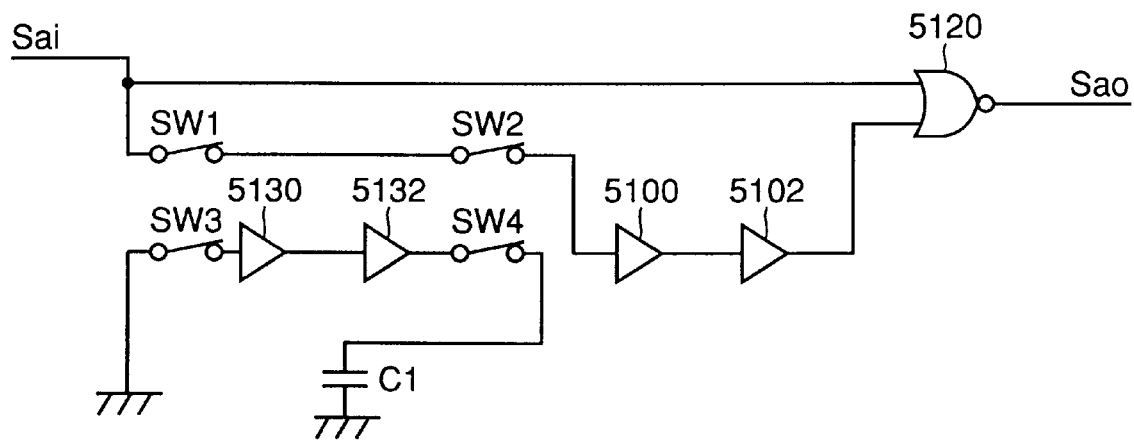
FIG. 26 is a schematic block diagram for illustrating a configuration of a waveform shaping circuit 5010.

FIG. 26 is a schematic block diagram for illustrating a configuration of FIG. 26 waveform shaping circuit 5010.

Waveform shaping circuit 5010 includes switches SW1 and SW2 successively receiving an input signal Sai, delay stages 5100 and 5102 successively delaying a signal input from switch SW2, and an NOR circuit 5120 having one input node receiving input signal Sai and the other input node receiving an output from delay stage 5102.

Waveform shaping circuit 5010 also includes a switch SW3 having one node receiving a ground potential, a delay stage 5130 having an input node connected to the other node of switch SW3, a delay stage 5132 having an input node receiving an output from delay stage 5130, a switch SW4 having one node receiving an output from delay stage 5132, and a capacitor C1 coupled between the other node of switch SW4 and a ground potential.

More specifically, waveform shaping circuit 5010 outputs an active low, pulsed signal only when waveform shaping circuit 5010 receives an active low, pulsed signal having a pulse length exceeding a predetermined period of time, i.e., a time corresponding to the sum of the delay times of delay stages 5100 and 5102.

Waveform shaping circuit 5012 is similar in configuration to waveform shaping circuit 5010.

Figure 27:
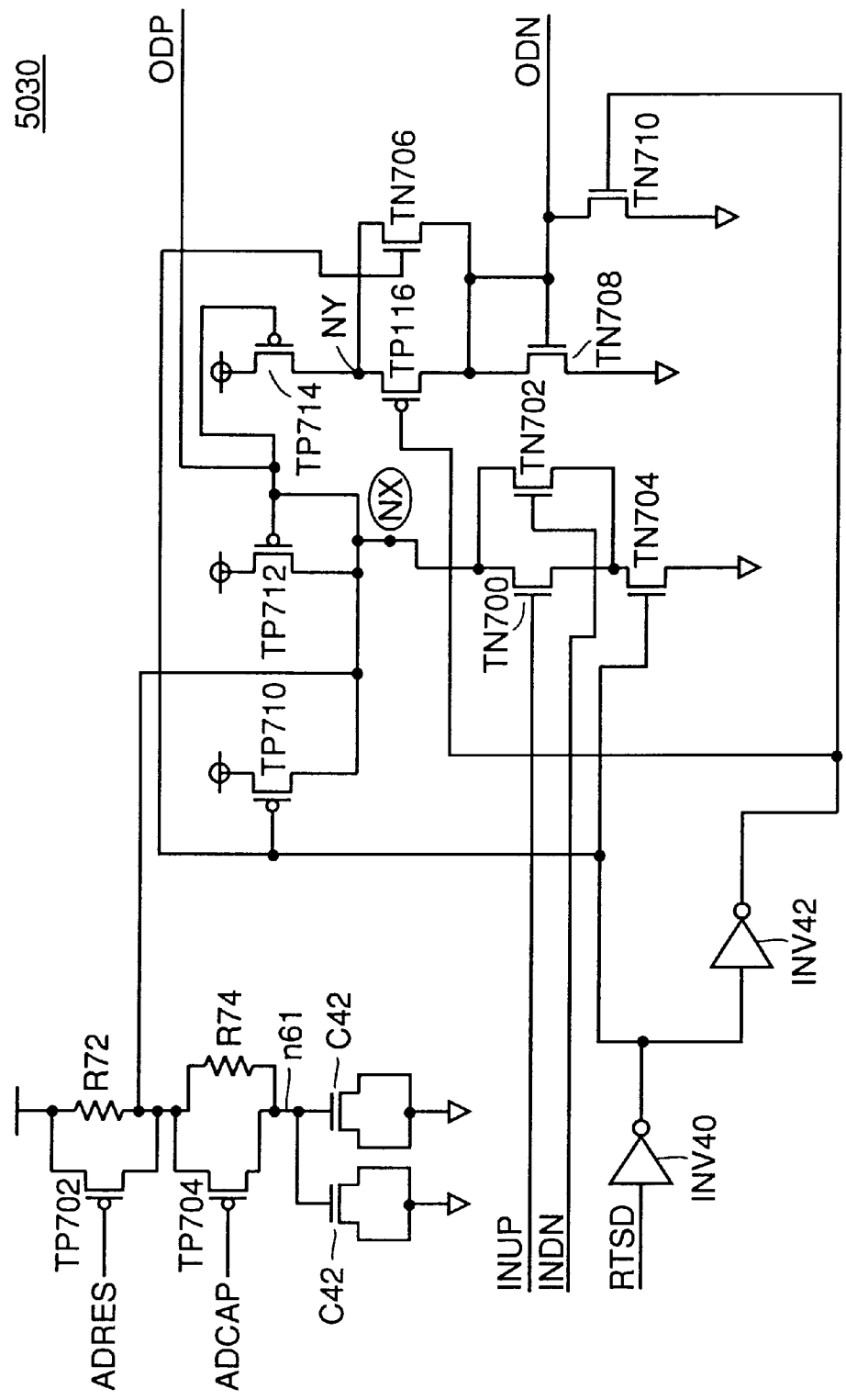
FIG. 27 is a circuit diagram showing a configuration of the FIG. 25 variable current supply 5030.

FIG. 27 is a circuit diagram showing a configuration of FIG. 25 variable current supply 5030.

Variable current supply 5030 includes an inverter INV40 receiving reset signal RSTD, an inverter INV42 receiving and inverting an output from inverter INV40, an N-channel MOS transistor TN704 having the gate receiving an output from inverter INV40 and the source connected to ground potential GND, an N-channel MOS transistor TN700 connected between transistor TN704 drain and an internal node NX and having the gate receiving an input signal INUP, an N-channel MOS transistor TN702 connected to transistor TN700 in parallel and having the gate receiving an input signal INDN, and a P-channel MOS transistor TP710 connected between power supply potential Vcc and internal node NX and having the gate receiving the output from inverter INV40.

Variable current supply 5030 also includes a P-channel MOS transistor TP712 coupled between internal node NX and power supply potential Vcc, and a P-channel MOS transistor TP714 connected between power supply potential Vcc and an internal node NY.

Transistors TP712 and TP714 gates are connected together and transistor TP712 gate and internal node NX are connected together, and thus transistors TP712 and TP714 configure a current mirror circuit.

Variable current supply 5030 also includes a P-channel MOS transistor TP716 having the source coupled with internal node NY and the gate receiving the output from inverter INV42, an N-channel MOS transistor TN706 connected to transistor TP716 in parallel and having the gate receiving the output from inverter INV40, an N-channel MOS transistor TN708 having the drain connected to transistor TP716 drain and transistor TN706 source and having the source coupled with ground potential GND, and an N-channel MOS transistor TN710 coupled between transistor TN708 gate and ground potential GND and having the gate receiving the output from inverter INV42.

The gate and drain of transistor TN708 are coupled together.

A potential of transistor TP712 gate is output as an output signal ODP and that of transistor TN708 gate is output as an output signal ODN.

Variable current supply 5030 also includes a resistor R72 provided between power supply potential Vcc and internal node NX, a P-channel MOS transistor TP702 connected to resistor R72 in parallel and having the gate receiving a signal RDRES, a resistor R74 coupled between internal node NX and an internal node n61, a P-channel MOS transistor TP704 provided in parallel with resistor R74 and having the gate receiving signal ADCAP, and MOS capacitors C41 and C42 provided between internal node n61 and ground potential GND in parallel.

Figure 28:
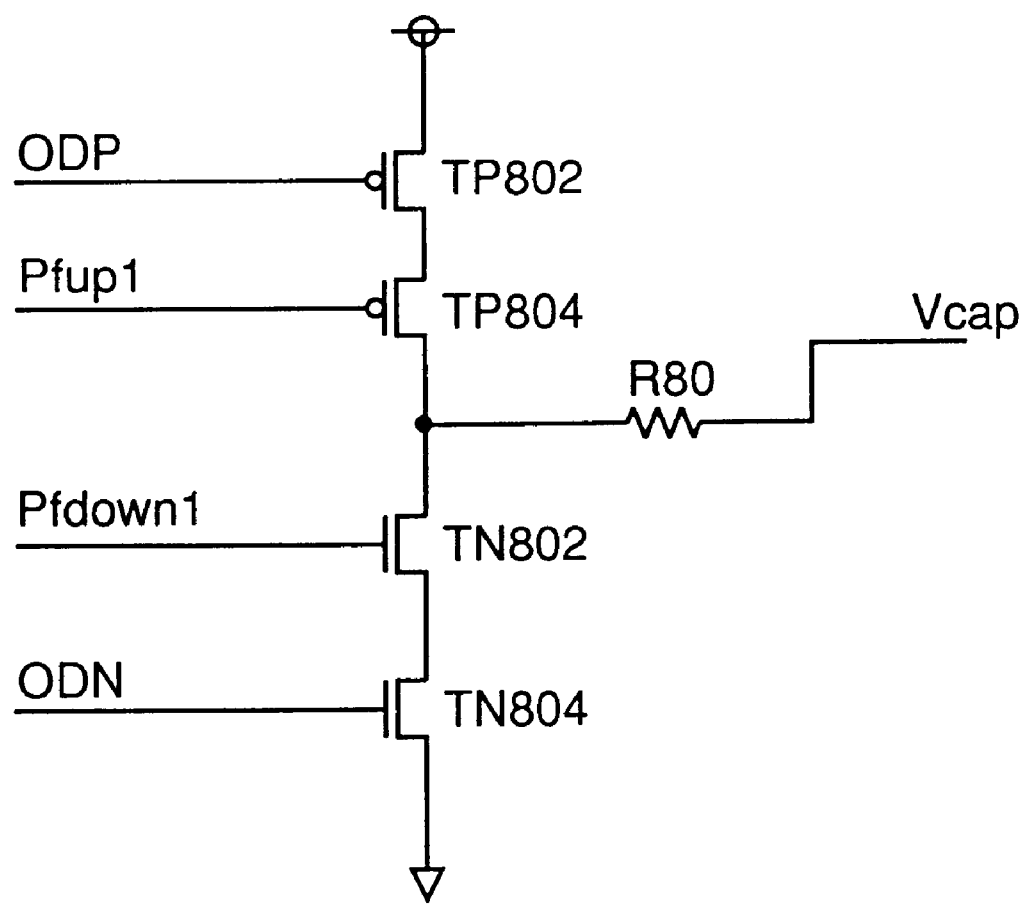
FIG. 28 is a circuit diagram for illustrating a configuration of the FIG. 25 charge pump circuit 5040.

FIG. 28 is a circuit diagram for illustrating a configuration of FIG. 25 charge pump circuit 5040.

Referring to FIG. 28, charge pump circuit 5040 includes P-channel MOS transistors TP802 and TP804 and N-channel MOS transistors TN802 and TN804 connected in series between power supply potential Vcc and ground potential GND, and a resistor R80 coupled between a connection node of transistors TP804 and TN802 and an output node.

Figure 29:
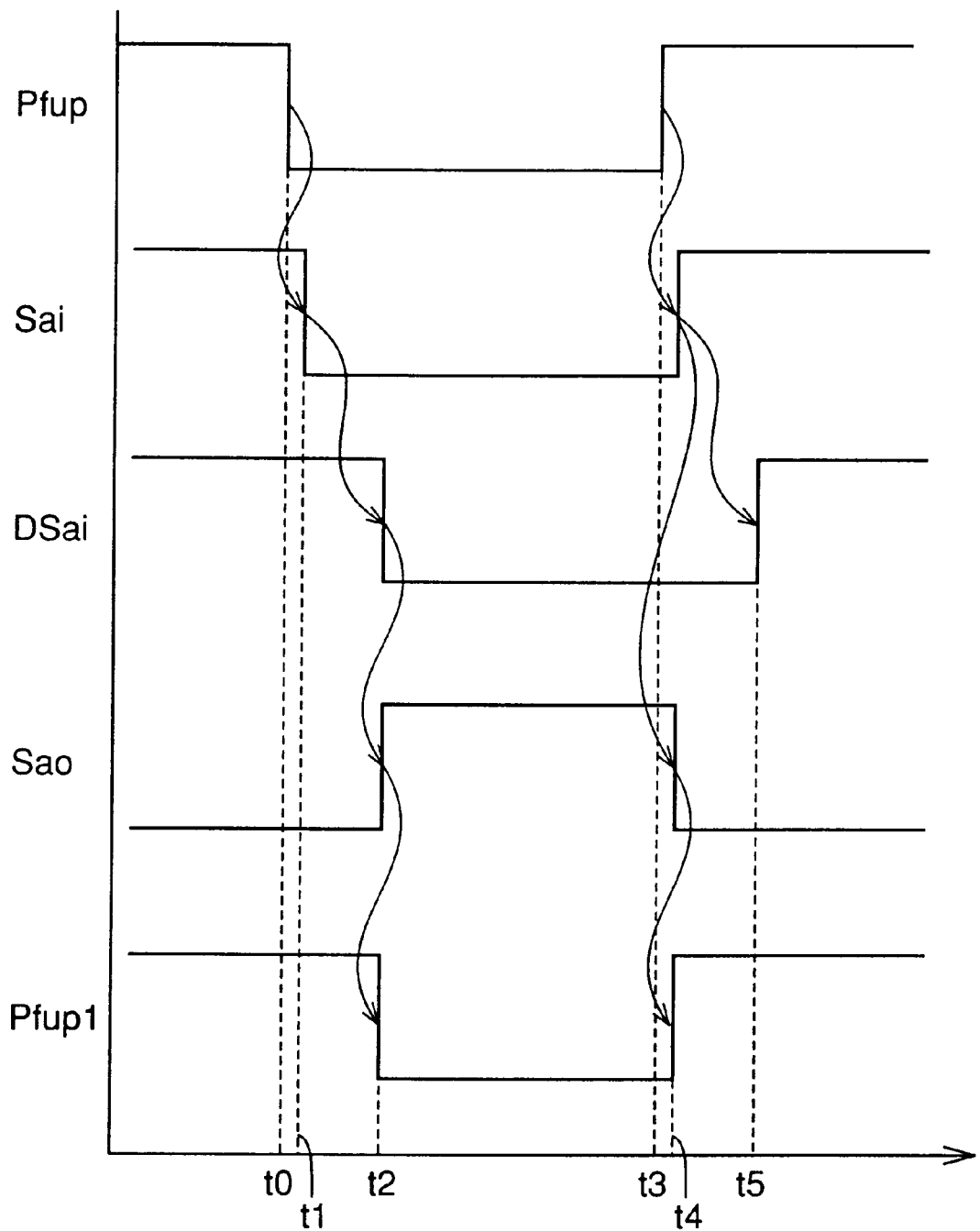
FIG. 29 illustrates waveform shaping circuit 5010 and charge pump circuit 5040 operations.
Figure 30:
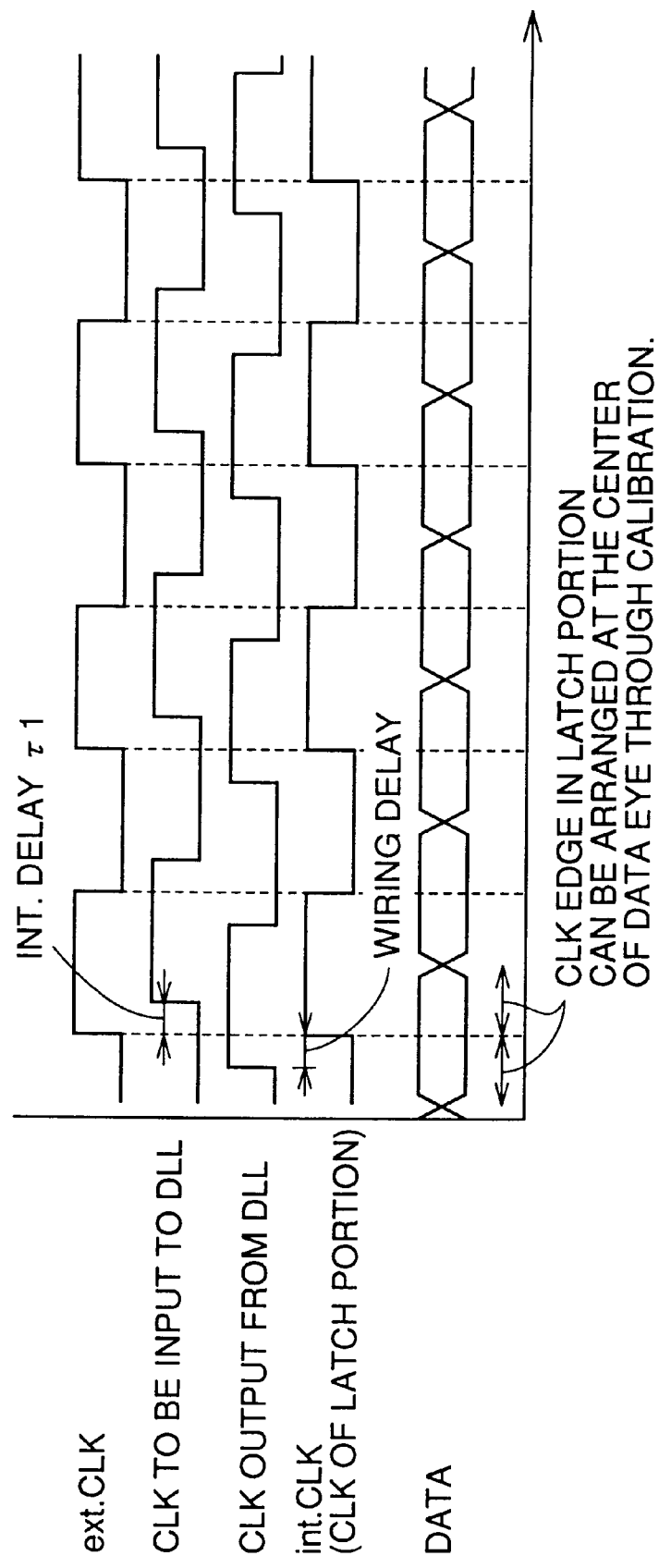
FIG. 30 is a timing chart for representing SDRAM operation when data is input.

FIG. 29 represents waveform shaping circuit 5010 and charge pump circuit 5040 operation.

Signal PfUP input from phase comparator circuit 4080 to inverter 5002 transitions from high to active low at time t0.

Responsively, input signal Sia of waveform shaping circuit 5010 transitions low at time t1. Output signal DSai of delay stage 5102 transitions low at time t2.

Only for the period from times t2 to t4, i.e., the period for which signals Sai and DSai are both held low, output signal Sao of NOR circuit 5120 goes high. Responsively, signal PafUP 1 supplied to charge pump circuit 5040 is activated (transitions low) for the period from times t2 to t4. Thus, if an activation period of signal Pfup is shorter than the sum of the delay times of delay stages 5100 and 5102, signal Pfup 1 is not activated (or does not transition low).

Thus, when internal and external clock signals int.CLK and ext.CLK have a large phase difference therebetween and a signal from phase comparator 4080 has an active period exceeding a predetermined period of time, a signal from charge pump circuit 5040 is supplied to charge pump circuit 4090. Thus, the operating current of ring oscillator circuit 4020 can be increased to phase the external and internal clock signals more rapidly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device synchronized with an external clock signal to receive an address signal and a control signal, comprising:
    a memory cell array having a plurality of memory cells arranged in rows and columns;
    a control circuit controlling an operation of said synchronous semiconductor memory device;
    a synchronizing internal signal generating circuit outputting an internal clock signal synchronized with said external clock signal;
    a synchronized-state detection circuit monitoring a condition of synchronization of said external and internal clock signals to generate a synchronized-state determination signal; and
    an output node for externally outputting said synchronized-state determination signal from said synchronous semiconductor memory device.

2. The synchronous semiconductor memory device according to claim 1, wherein said synchronized-state detection circuit includes:
    a first pulsed signal generation circuit generating a first pulsed signal having a first predetermined pulse length in response to at least an activating edge of said external clock signal;
    a second pulsed signal generation circuit generating a second pulsed signal having a second predetermined pulse length in response to at least an activating edge of said internal clock signal; and
    a logic circuit placing said synchronized-state determination signal in one of active and inactive states in response to a comparison result between an activation period of said first pulsed signal and an activation period of said second pulsed signal.

3. The synchronous semiconductor memory device according to claim 2, wherein:

said second predetermined pulse length is shorter than said first predetermined pulse length; and said logic circuit detects whether the activation period of said second pulsed signal is included in the activation period of said first pulsed signal to place said synchronized-state determination signal in one of the active and inactive states.

4. The synchronous semiconductor memory device according to claim 2, further comprising a control signal input circuit synchronized with said internal clock signal to receive and supply said control signal to said control circuit, said control circuit halting a process associated with said control signal when said synchronized-state determination signal indicates that said condition of synchronization is inappropriate.

5. The synchronous semiconductor memory device according to claim 2, further comprising a data input/output circuit holding and outputting data read from said memory cell selected in response to said address signal, said data input/output circuit suspending outputting said data when said synchronized-state determination signal indicates that said condition of synchronization is inappropriate.

6. The synchronous semiconductor memory device according to claim 2, wherein said logic circuit includes:

a flag generation circuit holding said synchronized-state determination signal inactive when said logic circuit detects that the activation period of said second pulsed signal is offset from the activation period of said first pulsed signal by at least a predetermined period; and a reset circuit controlling said flag generation circuit to activate said synchronized-state determination signal when the activation period of said second pulsed signal and the activation period of said first pulsed signal are offset from each other by less than said predetermined period of time.

7. The synchronous semiconductor memory device according to claim 6, wherein:

said second predetermined pulse length is shorter than said first predetermined pulse length; and said logic circuit detects whether the activation period of said second pulsed signal is included in the activation period of said first pulsed signal to place said synchronized-state determination signal in one of the active and inactive states.

8. The synchronous semiconductor memory device according to claim 1, wherein said synchronizing internal signal generating circuit includes:

a ring oscillator circuit generating said internal clock signal;

a phase comparing circuit making a comparison of a phase of said internal clock signal and a phase of said external clock signal;

a charge pump circuit generating a control voltage depending on said comparison result from said phase comparing circuit;

a control enhancement circuit enhancing an activation level of said control voltage when said comparison result from said phase comparing circuit indicates that there is a phase difference of no less than a predetermined value between said internal and external clock signals; and a voltage-current conversion circuit using said control voltage to control a value of an operating current of said ring oscillator circuit.

9. The synchronous semiconductor memory device according to claim 8, wherein:

said phase comparing circuit generates a comparison-result signal having a pulse length depending on said comparison result;

said charge pump circuit charges or discharges an internal node supplying said control voltage, depending on said pulse length of said comparison-result signal; and when said pulse length of said comparison-result signal has at least a predetermined length, said control enhancement circuit further charges or discharges said internal node charged or discharged by said change pump circuit.

10. The synchronous semiconductor memory device according to claim 9, wherein said synchronized-state detection circuit includes:

a first pulsed signal generation circuit generating a first pulsed signal having a first predetermined pulse length in response to at least an activating edge of said external clock signal;

a second pulsed signal generation circuit generating a second pulsed signal having a second predetermined pulse length in response to at least an activating edge of said internal clock signal; and a logic circuit placing said synchronized-state determination signal in one of active and inactive states in response to a comparison result between an activation period of said first pulsed signal and an activation period of said second pulsed signal.

11. The synchronous semiconductor memory device according to claim 10, wherein:

said second predetermined pulse length is shorter than said first predetermined pulse length; and said logic circuit detects whether the activation period of said second pulsed signal is included in the activation period of said first pulsed signal to place said synchronized-state determination signal in one of the active and inactive states.

12. The synchronous semiconductor memory device according to claim 1, further comprising a control signal input circuit synchronized with said internal clock signal to receive and supply said control signal to said control circuit, said control circuit halting a process associated with said control signal when said synchronized-state determination signal indicates that said condition of synchronization is inappropriate.

13. The synchronous semiconductor memory device according to claim 1, further comprising a data input/output circuit holding and outputting data read from said memory cell selected in response to said address signal, said data input/output circuit suspending outputting said read data when said synchronized-state determination signal indicates that said condition of synchronization is inappropriate.

14. A synchronous semiconductor memory device synchronized with an external clock signal to receive an address signal and a control signal, comprising:

a memory cell array having a plurality of memory cells arranged in rows and columns;

a control circuit controlling an operation of said synchronous semiconductor memory device;

a synchronizing internal signal generating circuit outputting an internal clock signal synchronized with said external clock signal;

a synchronized-state detection circuit monitoring a condition of synchronization of said external and internal clock signals to generate a synchronized-state determination signal; and an interface circuit transmitting said synchronized-state determination signal from said synchronized-state detection circuit to the outside of said synchronous semiconductor memory device.

* * * * *